United States Patent
Rezaei Zare

(10) Patent No.: US 11,422,179 B2
(45) Date of Patent: Aug. 23, 2022

(54) SYSTEM AND METHOD FOR GEOMAGNETIC DISTURBANCE DETERMINATION FOR POWER SYSTEMS

(71) Applicant: Afshin Rezaei Zare, Vaughan (CA)

(72) Inventor: Afshin Rezaei Zare, Vaughan (CA)

( * ) Notice: Subject to any disclaimer, the term of this patent is extended or adjusted under 35 U.S.C. 154(b) by 0 days.

(21) Appl. No.: 16/906,180

(22) Filed: Jun. 19, 2020

(65) Prior Publication Data

US 2020/0400735 A1 Dec. 24, 2020

Related U.S. Application Data

(60) Provisional application No. 62/864,202, filed on Jun. 20, 2019.

(51) Int. Cl.
*G01R 31/08* (2020.01)
*G01R 31/40* (2020.01)

(52) U.S. Cl.
CPC ......... *G01R 31/086* (2013.01); *G01R 31/088* (2013.01); *G01R 31/40* (2013.01)

(58) Field of Classification Search
CPC ..... G01R 31/086; G01R 31/40; G01R 31/088
See application file for complete search history.

(56) References Cited

U.S. PATENT DOCUMENTS 9,613,271 B2 * 4/2017 Basu ................. G06K 9/00523

OTHER PUBLICATIONS

Komal S Shetye, Adam B Birchfield, Raymund H Lee, Thomas J Overbye, Jennifer L Gannon: Impact of 1D vs 3D Earth Conductivity Based Electric Fields on Geomagnetically Induced Currents (Year: 2018).*
Feng-xia He, Xue-Ling Mu, Lian-guang Liu: Wavelet De-noising and Correlation Analysis in GIC Signal during Magnetic. (Year: 2008).*
N. Zaourar1, M. Hamoudi1, M. Mandea2, G. Balasis3, and M. Holschneider4: Wavelet-based multiscale analysis of geomagnetic disturbance. (Year: 2013).*
Taebi, A., Mansy, H.A.: 'Time-frequency distribution of seismocardiographic signals: a comparative study', Bioengineering, Basel, Switzerland, 2017, 4, (2), p. 32.

(Continued)

*Primary Examiner* — Judy Nguyen
*Assistant Examiner* — Joseph O Nyamogo
(74) *Attorney, Agent, or Firm* — Bhole IP Law; Anil Bhole; Marc Lampert

(57) ABSTRACT

A system and method for geomagnetic disturbance determination for a power system, the method including: receiving sensor data including an electric field experienced by one or more portions of the power system; determining a total Geomagnetically Induced Current (GIC) as a multi-variable function of phasors in two field directions proportional to the experienced electric field; determining one or more maximum magnitudes of the total GIC and a corresponding direction; and outputting the determined one or more maximum GIC magnitudes and the corresponding directions. In a particular case, determining the one or more maximum magnitudes of the total GIC and the corresponding direction includes setting a gradient of the total GIC to zero to determine one or more extremum points.

16 Claims, 24 Drawing Sheets

(56) References Cited

OTHER PUBLICATIONS

A. Haddadi, A. Rezaei-Zare, L. Gerin-Lajoie, R. Hassani, and J. Mahseredjian, "A Modified IEEE 118-Bus Test Case for Geomagnetic Disturbance Studies—Part I: Model Data," IEEE Trans. Electromagn. Compat., pp. 1-11, 2019.
A. Haddadi, L. Gerin-Lajoie, A. Rezaei-Zare, R. Hassani, and J. Mahseredjian, "A Modified IEEE 118-Bus Test Case for Geomagnetic Disturbance Studies—Part II: Simulation Results," IEEE Trans. Electromagn. Compat., pp. 1-10, 2019.
A. Levant, "Robust exact differentiation via sliding mode technique," Automatica, vol. 34, No. 3, pp. 379-384, 1998.
A. Pulkkinen et al., "Geomagnetically induced currents: Science, engineering, and applications readiness," Space Weather, vol. 15, No. 7, pp. 828-856, 2017.
A. Rezaei-Zare and A. H. Etemadi, "Optimal Placement of GIC Blocking Devices Considering Equipment Thermal Limits and Power System Operation Constraints," IEEE Trans. Power Del., vol. 33, No. 1, pp. 200-208, 2018.
A. Rezaei-Zare, "Behavior of Single-Phase Transformers Under Geomagnetically Induced Current Conditions," IEEE Trans. Power Del., vol. 29, No. 2, pp. 916-925, 2014.
A. Rezaei-Zare, "Reactive Power Loss Versus GIC Characteristic of Single-Phase Transformers," IEEE Trans. Power Del., vol. 30, No. 3, pp. 1639-1640, 2015.
A. Sheinker, A. Shkalim, N. Salomonski, B. Ginzburg, L. Frumkis, and B.-Z. Kaplan, "Processing of a scalar magnetometer signal contaminated by $1/f\alpha$ noise," Sensors and Actuators A: Physical, vol. 138, No. 1, pp. 105-111, 2007.
Aboura, F., Touhami, O.: 'Effect of the GICs on magnetic saturation of asymmetric three-phase transformed', IET Electr. Power Appl., 2017, 11, (7), pp. 1306-1314.
B. Dufay et al., "Low Frequency Excess Noise Source Investigation of Off-Diagonal GMI-Based Magnetometers," IEEE Trans. Magn., vol. 53, No. 1, pp. 1-6, 2017.
Boteler, D.H., Pirjola, R., Trichtchenko, L.: 'On calculating the electric and magnetic fields produced in technological systems at the earth's surface by a 'wide' electrojet', J. Atmos. Sol.-Terr. Phys., 2000, 62, (14), pp. 1311-1315.
Boteler, D.H., Pirjola, R.J.: 'The complex-image method for calculating the magnetic and electric fields produced at the surface of the earth by the auroral electrojet', Geophys. J. Int., 1998, 132, (1), pp. 31-40.
Boteler, D.H.: 'Geomagnetically induced currents: present knowledge and future research', IEEE Trans. Power Deliv., 1994, 9, (1), pp. 50-58.
C. Chen, J. Wang, and D. Ton, "Modernizing Distribution System Restoration to Achieve Grid Resiliency Against Extreme Weather Events: An Integrated Solution," Proc. IEEE, vol. 105, No. 7, pp. 1267-1288, 2017.
D. Cilden-Guler, Z. Kaymaz, and C. Hajiyev, "Assessment of Magnetic Storm Effects under Various Magnetometer Noise Levels for Satellite Attitude Estimation," in 2019 9th International Conference on Recent Advances in Space Technologies (RAST),, Istanbul, Turkey, 2019, pp. 769-773.
D. H. Boteler and E. Bradley, "On the Interaction of Power Transformers and Geomagnetically Induced Currents," IEEE Trans. Power Delivery, vol. 31, No. 5, pp. 2188-2195, 2016.
U.S. Department of Energy, Geomagnetic Disturbance Monitoring Approach and Implementation Strategies. Washington, D.C., 2019. [Online]. Available: https://www.energy.gov/sites/prod/files/2019/06/f64/DOE_GMD_Monitoring_January2019_508v2.pdf.
Daubechies, I., Lu, J., Wu, H.-T.: 'Synchrosqueezed wavelet transforms: an empirical mode decomposition-like tool', Appl. Comput. Harmon. Anal., 2011, 30, (2), pp. 243-261.
Etemadi, A.H., Rezaei-Zare, A.: 'Optimal placement of GIC blocking devices for geomagnetic disturbance mitigation', IEEE Trans. Power Syst., 2014, 29, (6), pp. 2753-2762.
G. S. Lakhina, S. Alex, B. T. Tsurutani, and W. D. Gonzalez, "Research on Historical Records of Geomagnetic Storms," Proc. IAU, vol. 2004, IAUS226, pp. 3-15, 2004.
Girgis, R., Vedante, K.: 'Effects of GIC on power transformers and power systems'. 2012 IEEE/PES Transmission and Distribution Conf. and Exposition (T&D), Orlando, FL, USA, Jul. 5-10, 2012, pp. 1-8.
Guillon, S., Toner, P., Gibson, L., et al.: 'A colorful blackout: the havoc caused by auroral electrojet generated magnetic field variations in 1989', IEEE Power Energy Mag., 2016, 14, (6), pp. 59-71.
H. Karami, K. Sheshyekani, A. Rezaei-Zare, and J. Mahseredjian, "Effect of Mixed Propagation Path on Electromagnetic Fields at Ground Surface Produced by Electrojet," IEEE Trans. Electromagn. Compat., vol. 60, No. 6, pp. 2019-2024, 2018.
T. Wang, C. Kang, and G. Chai, "Low-Frequency Noise Evaluation on a Commercial Magnetoimpedance Sensor at Submillihertz Frequencies for Space Magnetic Field Detection," Sensors (Basel, Switzerland), vol. 19, No. 22, 2019.
J. Ma and T. Uchiyama, "High Performance Single Element MI Magnetometer With Peak-to-Peak Voltage Detector by Synchronized Switching," IEEE Trans. Magn., vol. 53, No. 11, pp. 1-4, 2017.
L. Marti, A. Rezaei-Zare, and A. Narang, "Simulation of Transformer Hotspot Heating due to Geomagnetically Induced Currents," IEEE Trans. Power Del., vol. 28, No. 1, pp. 320-327, 2013.
L. Marti, A. Rezaei-Zare, and D. Boteler, "Calculation of Induced Electric Field During a Geomagnetic Storm Using Recursive Convolution," IEEE Trans. Power Delivery, vol. 29, No. 2, pp. 802-807, 2014.
L. Marti, C. Yiu, A. Rezaei-Zare, and D. Boteler, "Simulation of Geomagnetically Induced Currents With Piecewise Layered-Earth Models," IEEE Trans. Power Del., vol. 29, No. 4, pp. 1886-1893, 2014.
X. Shao and C. Ma, "A general approach to derivative calculation using wavelet transform," Chemometrics and Intelligent Laboratory Systems, vol. 69, No. 1, pp. 157-165, 2003.
M. Butta and I. Sasada, "Sources of Noise in a Magnetometer Based on Orthogonal Fluxgate Operated in Fundamental Mode," IEEE Trans. Magn., vol. 48, No. 4, pp. 1508-1511, 2012.
M. Janosek, M. Butta, M. Dressler, E. Saunderson, D. Novotny, and C. Fourie, "1-pT Noise Fluxgate Magnetometer for Geomagnetic Measurements and Unshielded Magnetocardiography," IEEE Trans. Instrum. Meas., vol. 69, No. 5, pp. 2552-2560, 2020.
M. Rezaei-Zare, M. Ariannik, and A. Rezaei-Zare, "Real-time detection of vulnerable power system areas to geomagnetic disturbance," IET Generation, Transmission & Distribution, vol. 14, No. 18, pp. 3838-3845, 2020.
Z. Wang, Y. Shen, X. Zhang, and Q. Wang, "Fault diagnosis based on numerical differentiation using wavelet transform," in IEEE Int. Instrumentation and Measurement Technology Conf, Graz, Austria, 2012, pp. 2722-2726.
Zhao, Y., Crossley, P.A., David, T.: 'Impact of dc bias on operating performance of current transformers', J. Eng., 2018, 2018, (15), pp. 930-934.
Marti, L., Rezaei-Zare, A., Yan, A.: 'Modelling considerations for the hydro one real-time GMD management system'. 2013 IEEE Power & Energy Society General Meeting, Canada, Jul. 21-25, 2013, pp. 1-6.
Auger, F., Flandrin, P., Lin, Y.-T., et al.: 'Time-frequency reassignment and synchrosqueezing: an overview', IEEE Signal Process. Mag., 2013, 30, (6), pp. 32-41.
N. Orani, A. Pisano, and E. Usai, "On a new sliding-mode differentiation scheme," in IEEE Int. Conf. on Industrial Technology, Mumbai, India, 2006, pp. 2652-2657.
NERC, "Special reliability assessment interim report: Effects of geomagnetic disturbances on the bulk power system," Feb. 2012. [Online]. Available: https://www.eenews.net/assets/2012/02/29/document_pm_01.pdf.
North American Electric Reliability Corporation (NERC): 'Application guide: computing geomagnetically-induced current in the bulk-power system', 2013.

(56) References Cited

OTHER PUBLICATIONS

North American Electric Reliability Corporation (NERC): 'Geomagnetic disturbance planning guide', 2013.

P. R. Price, "Geomagnetically induced current effects on transformers," IEEE Trans. Power Del., vol. 17, No. 4, pp. 1002-1008, 2002.

P. Werle, A. Akbari, H. Borsi, and E. Gockenbach, "Enhanced online PD evaluation on power transformers using wavelet techniques and frequency rejection filter for noise suppression," in IEEE int. symposium on electrical insulation, Boston, MA, USA, 2002, pp. 195-198.

Ariannik,, Mohamadreza , et al., "Processing Magnetometer Signals for Accurate Wide-Area Geomagnetic Disturbance Monitoring and Resilience Analysis".

R. Chartrand, "Numerical differentiation of noisy, nonsmooth, multidimensional data," in IEEE Global Conf. on Signal and Information Processing, Montreal, QC, 2017, pp. 244-248.

R. Garcia-Bermudez et al., "Evaluation of the Differentiation of Noisy Electrooculographic Records Using Continuous Wavelet Transform," in LNCS sublibrary. SL 8, Bioinformatics, vol. 10208, Bioinformatics and biomedical engineering, I. Rojas and F. Ortuño, Eds., Cham, Switzerland: Springer, 2017, pp. 557-566.

R. Horton, D. Boteler, T. J. Overbye, R. Pirjola, and R. C. Dugan, "A Test Case for the Calculation of Geomagnetically Induced Currents," IEEE Trans. Power Delivery, vol. 27, No. 4, pp. 2368-2373, 2012.

R. J. Pirjola, "Modelling the electric and magnetic fields at the Earths surface due to an auroral electrojet," Journal of Atmospheric and Solar-Terrestrial Physics, vol. 60, No. 11, pp. 1139-1148, 1998.

R. Pirjola, "Geomagnetically induced currents during magnetic storms," IEEE Trans. Plasma Sci., vol. 28, No. 6, pp. 1867-1873, 2000.

Yang, P.-H., Li, Y., Liu, L.-G., et al.: 'Optimal placement of grounding small resistance in neutral point for restraining voltage fluctuation in power grid caused by geomagnetic storm', IET Gener. Trans. Distrib., 2019, 13, (8), pp. 1456-1465.

Schafer, R.: 'What is a Savitzky-Golay filter? [lecture notes]', IEEE Signal Process. Mag., 2011, 28, (4), pp. 111-117.

\* cited by examiner

SYSTEM AND METHOD FOR GEOMAGNETIC DISTURBANCE DETERMINATION FOR POWER SYSTEMS

TECHNICAL FIELD

The present disclosure relates generally to power systems and power system components. More particularly, the present disclosure relates to a system and method for geomagnetic disturbance determination for power systems.

BACKGROUND

Geomagnetic Disturbance (GMD) is a kind of natural event that can induce voltage in the earth layers and on the transmission lines and drive the Geomagnetically Induced Current (GIC) in power system. Very low frequency nature of GIC within 0.1-100 mHz range causes quasi-dc effects with detrimental consequences in the power system and transformers. The March 1989 Hydro-Quebec power system blackout due to GMD is a prominent event which left nine million people without power and an estimated damage cost of $300 million. However, it is a significant technical challenge to identify vulnerable areas of power system during GMD in real-time to maintain the power system stability and prevent the equipment damage.

SUMMARY

In an aspect, there is provided a method for geomagnetic disturbance determination for a power system, the method executed on one or more processors, the method comprising: receiving sensor data comprising an electric field experienced by one or more portions of the power system; determining a total Geomagnetically Induced Current (GIC) as a multi-variable function of phasors in two field directions proportional to the experienced electric field; determining one or more maximum magnitudes of the total GIC and a corresponding direction; and outputting the determined one or more maximum GIC magnitudes and the corresponding directions.

In a particular case of the method, determining the one or more maximum magnitudes of the total GIC and the corresponding direction comprises setting a gradient of the total GIC to zero to determine one or more extremum points.

In another case of the method, the method further comprising determining a corresponding critical solution point to check whether a solution point to setting the gradient of the total GIC to zero is an extremum point.

In yet another case of the method, the solution point is an extremum point if a determinant of a Hessian matrix of the critical solution point is greater than zero.

In yet another case of the method, the method further comprising determining the gradient of the total GIC comprises determining derivatives of the experience electric field using continuous wavelet transform.

In yet another case of the method, the method further comprising determining a global maximum magnitude by solving for angular frequency.

In yet another case of the method, the method further comprising determining elements in the power system at risk of failure by comparing the one or more maximum GIC magnitudes with withstand capabilities associated with each of the elements.

In yet another case of the method, the method further comprising despiking the sensor data using median filtering.

In yet another case of the method, the method further comprising despiking the sensor data using replacement at peak of differences (RPD) comprising replacing a center point of a window of the sensor data using median filtering to generate a filtered signal, subtracting the filtered signal from the original sensor data to generate a difference signal, applying a prominence threshold to the difference signal to detect spikes, and replacing the spikes with a weighted average.

In yet another case of the method, the method further comprising despiking the sensor data using wavelet decomposition by determining stationary wavelet transform using a sym4 wavelet at a decomposition level of one.

In another aspect, there is provided a system for geomagnetic disturbance determination for a power system, the system comprising one or more processors in communication with a memory storage, the one or more processors configurable to execute: a measurement module to receive sensor data comprising an electric field experienced by one or more portions of the power system; a determination module to determine a total Geomagnetically Induced Current (GIC) as a multi-variable function of phasors in two field directions proportional to the experienced electric field, and to determine one or more maximum magnitudes of the total GIC and a corresponding direction; and an output module to output the determined one or more maximum GIC magnitudes and the corresponding directions.

In a particular case of the system, determining the one or more maximum magnitudes of the total GIC and the corresponding direction comprises setting a gradient of the total GIC to zero to determine one or more extremum points.

In another case of the system, the determination module further determines a corresponding critical solution point to check whether a solution point to setting the gradient of the total GIC to zero is an extremum point.

In yet another case of the system, the solution point is an extremum point if a determinant of a Hessian matrix of the critical solution point is greater than zero.

In yet another case of the system, determining the gradient of the total GIC comprises determining derivatives of the experience electric field using continuous wavelet transform.

In yet another case of the system, the determination module further determines a global maximum magnitude by solving for angular frequency.

In yet another case of the system, the determination module further determines elements in the power system at risk of failure by comparing the one or more maximum GIC magnitudes with withstand capabilities associated with each of the elements.

In yet another case of the system, the measurement module further despikes the sensor data using median filtering.

In yet another case of the system, the measurement module further despikes the sensor data using replacement at peak of differences (RPD) comprising replacing a center point of a window of the sensor data using median filtering to generate a filtered signal, subtracting the filtered signal from the original sensor data to generate a difference signal, applying a prominence threshold to the difference signal to detect spikes, and replacing the spikes with a weighted average.

In yet another case of the system, the measurement module further despikes the sensor data using wavelet decomposition by determining stationary wavelet transform using a sym4 wavelet at a decomposition level of one.

These and other aspects are contemplated and described herein. It will be appreciated that the foregoing summary sets out representative aspects of systems and methods to assist skilled readers in understanding the following detailed description.

BRIEF DESCRIPTION OF THE DRAWINGS

The features of the invention will become more apparent in the following detailed description in which reference is made to the appended drawings wherein.

DETAILED DESCRIPTION

Figure 1:
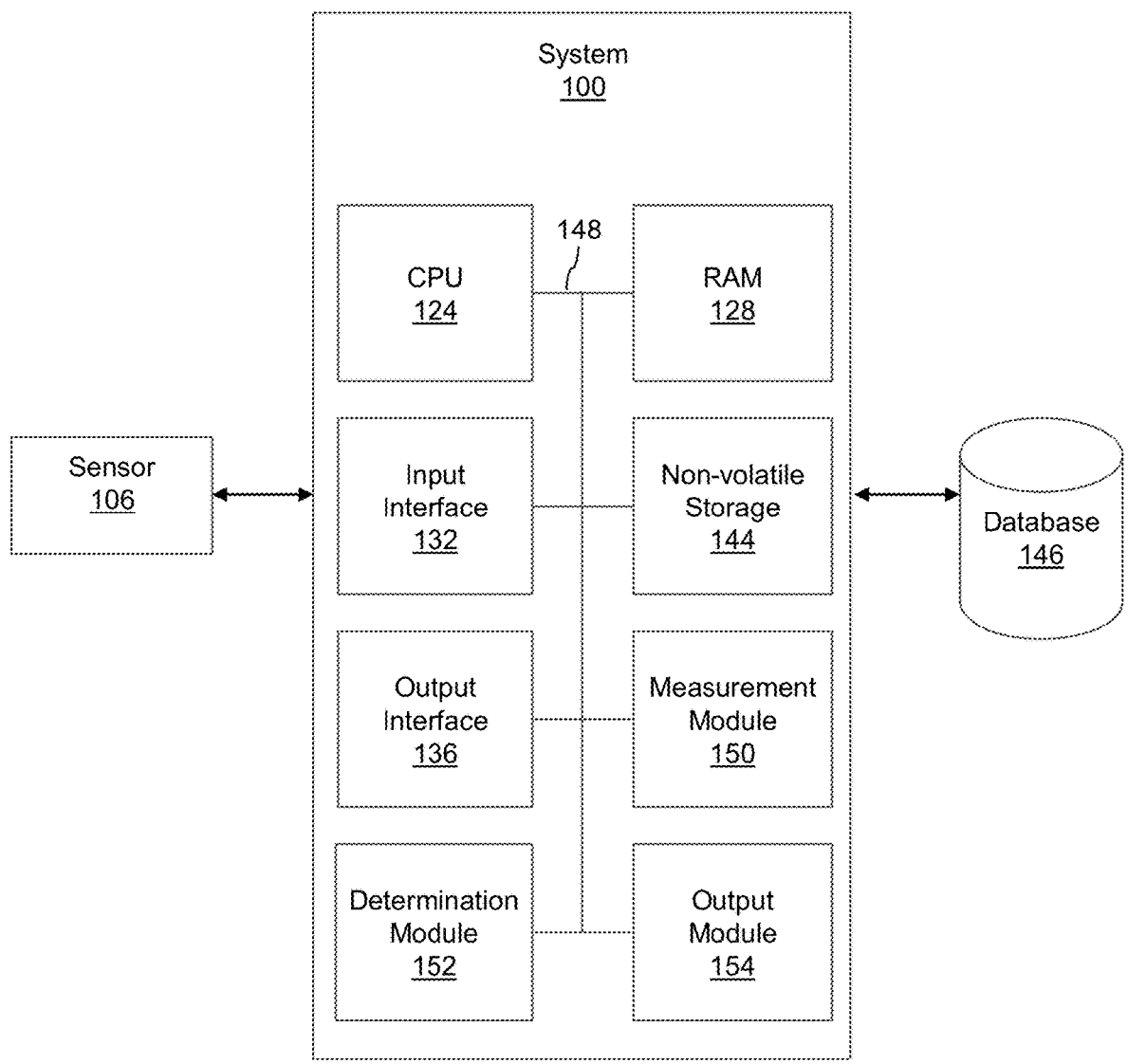
FIG. 1 is a block diagram of a system for geomagnetic disturbance determination for power systems, in accordance with an embodiment.

Embodiments will now be described with reference to the figures. For simplicity and clarity of illustration, where considered appropriate, reference numerals may be repeated among the Figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, well-known methods, procedures and components have not been described in detail so as not to obscure the embodiments described herein. Also, the description is not to be considered as limiting the scope of the embodiments described herein.

Various terms used throughout the present description may be read and understood as follows, unless the context indicates otherwise: "or" as used throughout is inclusive, as though written "and/or"; singular articles and pronouns as used throughout include their plural forms, and vice versa; similarly, gendered pronouns include their counterpart pronouns so that pronouns should not be understood as limiting anything described herein to use, implementation, performance, etc. by a single gender; "exemplary" should be understood as "illustrative" or "exemplifying" and not necessarily as "preferred" over other embodiments. Further definitions for terms may be set out herein; these may apply to prior and subsequent instances of those terms, as will be understood from a reading of the present description.

Any module, unit, component, server, computer, terminal, engine or device exemplified herein that executes instructions may include or otherwise have access to computer readable media such as storage media, computer storage media, or data storage devices (removable and/or non-removable) such as, for example, magnetic disks, optical disks, or tape. Computer storage media may include volatile and non-volatile, removable and non-removable media implemented in any method or technology for storage of information, such as computer readable instructions, data structures, program modules, or other data. Examples of computer storage media include RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by an application, module, or both. Any such computer storage media may be part of the device or accessible or connectable thereto. Further, unless the context clearly indicates otherwise, any processor or controller set out herein may be implemented as a singular processor or as a plurality of processors. The plurality of processors may be arrayed or distributed, and any processing function referred to herein may be carried out by one or by a plurality of processors, even though a single processor may be exemplified. Any method, application or module herein described may be implemented using computer readable/executable instructions that may be stored or otherwise held by such computer readable media and executed by the one or more processors.

The following relates generally to power systems and power system components. More particularly, the present disclosure relates to a system and method for geomagnetic disturbance determination for power systems.

The Geomagnetic Disturbance (GMD) vulnerability of a power system and equipment highly depends on the magnitude of the Geomagnetically Induced Current (GIC). Thus, to ensure reliable operation of the power system during a solar storm, it is a substantial technical challenge of great importance to identify the vulnerable lines and transformers carrying high GIC magnitudes, especially in real time, and thereby potentially save assets from the failure and provide appropriate mitigating measures during the storm.

Depending on the direction of the induced electric field, also referred to as geoelectric field, different areas of power system subject to high GIC flow. Therefore, a primitive approach is to sweep all possible directions of the geoelectric field over a full- or semi-circle angle, i.e., 360 or 180 degrees, to find the maximum GIC flow for each individual element of the system. However, such an approach is time consuming and its simulation time and accuracy depend on the angle step change assumed in the simulation. For offline studies, such drawbacks may not be a concern; however, this is generally not acceptable in real-time applications or power system optimizations demanding a high number of simulations. Advantageously, the present embodiments provide a fast and efficient approach for automatically determining vulnerable elements of the power system to a sufficient level of accuracy.

Some approaches to find a maximum GIC flow is based on two GIC magnitudes obtained from two orthogonal geoelectric fields, e.g., northward and eastward. However, this approach is generally only applicable to single-zone (uniform) earth model.

Embodiments of the present disclosure advantageously use the fact that by knowing a response of a power system to two perpendicular directions of the magnetic storm, a maximum GIC and a storm angle at which the maximum GIC occurs can be automatically determined. The present embodiments can not only be applied to transmission lines which have geographical distribution and direction, but also to identify a maximum GIC flow in non-distributed equipment such as transformers and substations. In further embodiments, the implementation of the two-orthogonal-fields can be extended to multi-zone (non-uniform) earth structure taking into account the frequency-dependency of the earth surface impedance. The present inventors experimentally verified the present embodiments in example experiments as applied on the Ontario transmission system, and the results of the embodiments were compared with the results of the angle sweep approach.

Turning to FIG. 1, shown therein is a diagram for a system for geomagnetic disturbance determination for power systems 100, in accordance with an embodiment. The system 100 can include a number of physical and logical components, including a central processing unit ("CPU") 124, random access memory ("RAM") 128, an input interface 132, an output interface 136, memory comprising non-volatile storage 144, and a local bus 148 enabling CPU 124 to communicate with the other components. CPU 124 can include one or more processors. RAM 128 provides relatively responsive volatile storage to CPU 124. The input interface 132 enables a user to provide input via, for example, a touchscreen. The output interface 136 outputs information to output devices, for example, to the touchscreen. Non-volatile storage 144 can store computer-executable instructions for implementing the system 100, as well as any derivative or other data. In some cases, this data can be stored or synced with a database 146, that can be local to the system 100 or remotely located (for example, a centralized server or cloud repository). During operation of the system 100, data may be retrieved from the non-volatile storage 144 and placed in RAM 128 to facilitate execution. In an embodiment, the CPU 124 can be configured to execute various modules, for example, a measurement module 150, a determination module 152, and an output module 154. The system 100 can be in communication with one or more sensors 106, as described herein; for example, appropriate magnetometer sensors or appropriate current sensors.

Figure 3:
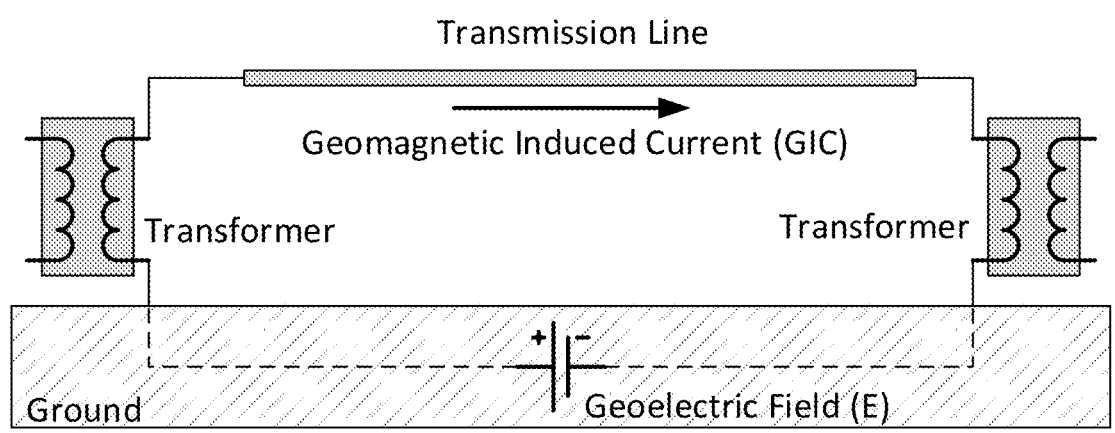
FIG. 3 illustrates an example flow of Geomagnetically Induced Current (GIC) in transmission lines and transformers due to geoelectric field induced in ground.
Figure 4:
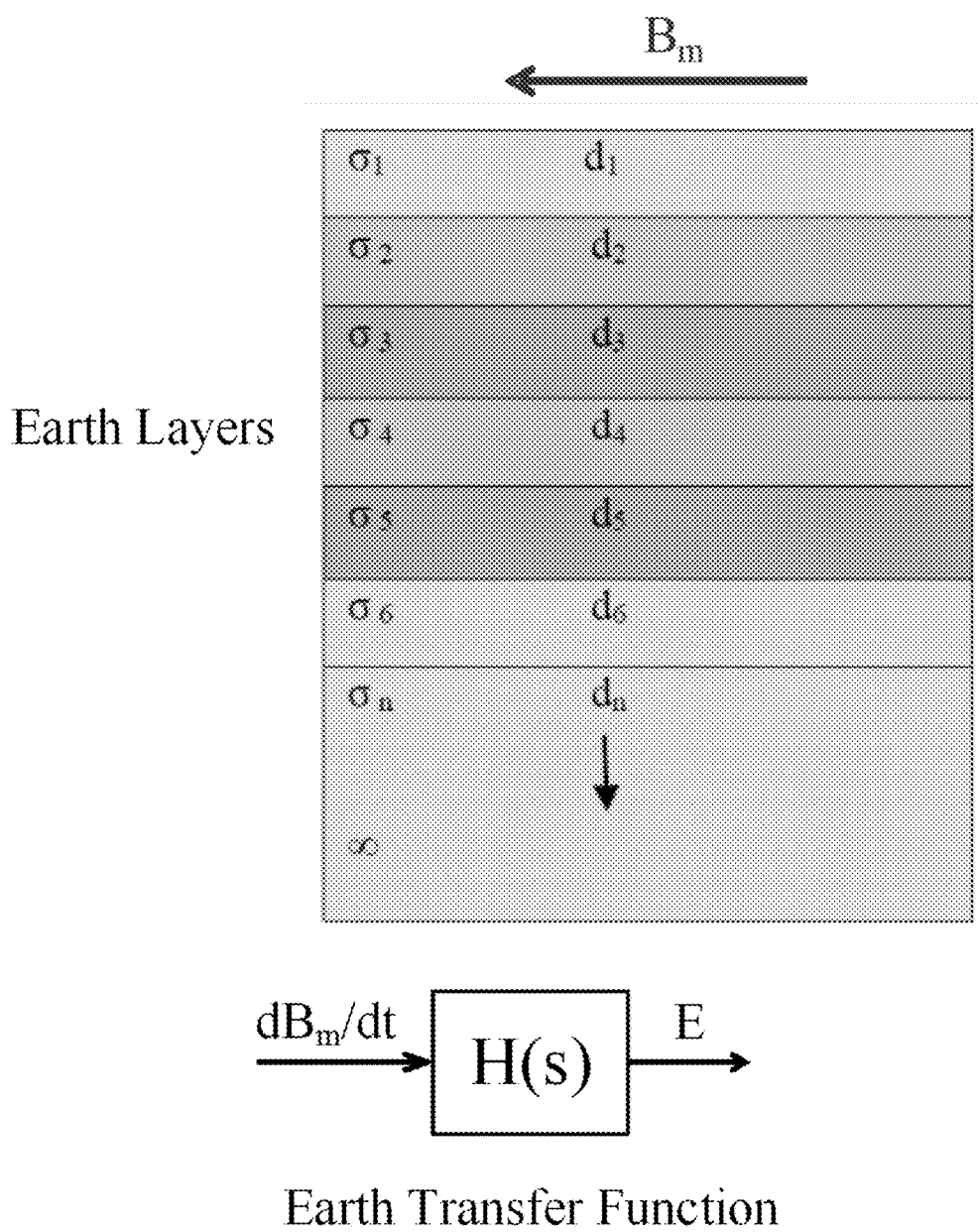
FIG. 4 illustrates an example diagram of obtaining a geoelectric field from a transfer function of a multi-layer earth model.

FIG. 3 illustrates an example flow of GIC in transmission lines and transformers due to geoelectric field induced in ground. When the GMD occurs, change of the earth magnetic field over the earth surface induces a voltage in ground which is referred to as geoelectric field, as denoted by E in FIG. 3. In the high voltage transmission systems, transformer neutral points are connected to the ground grid of the substation. Thus, a closed circuit is formed for induced voltage E through the transformers and the connected transmission lines, FIG. 3, and thus the GIC, which is the origin of adverse consequences, is injected into the power system. The severity of GMD depends on the induced voltage E and this voltage is in turn influenced by the earth structure and electrical conductivity. Therefore, to obtain E, the earth can be modeled based on a multi-layer structure as shown in FIG. 4, where the depth and electrical conductivity of i-th layer of the ground are denoted by $d_i$ and $\sigma_i$, respectively. FIG. 4 illustrates an example diagram of obtaining the geoelectric field E from the transfer function of the multi-layer earth model H(s), based on the measured magnetic field $B_m$ at the ground surface.

If the magnetic field at the ground surface is measured and known, the geoelectric field E can be obtained based on the frequency response of the earth model, which shown by the transfer function H(s) in FIG. 4. Accordingly, with the change of magnetic field as the input, the induced electric field E can be obtained from the earth transfer function as the output.

Figure 5:
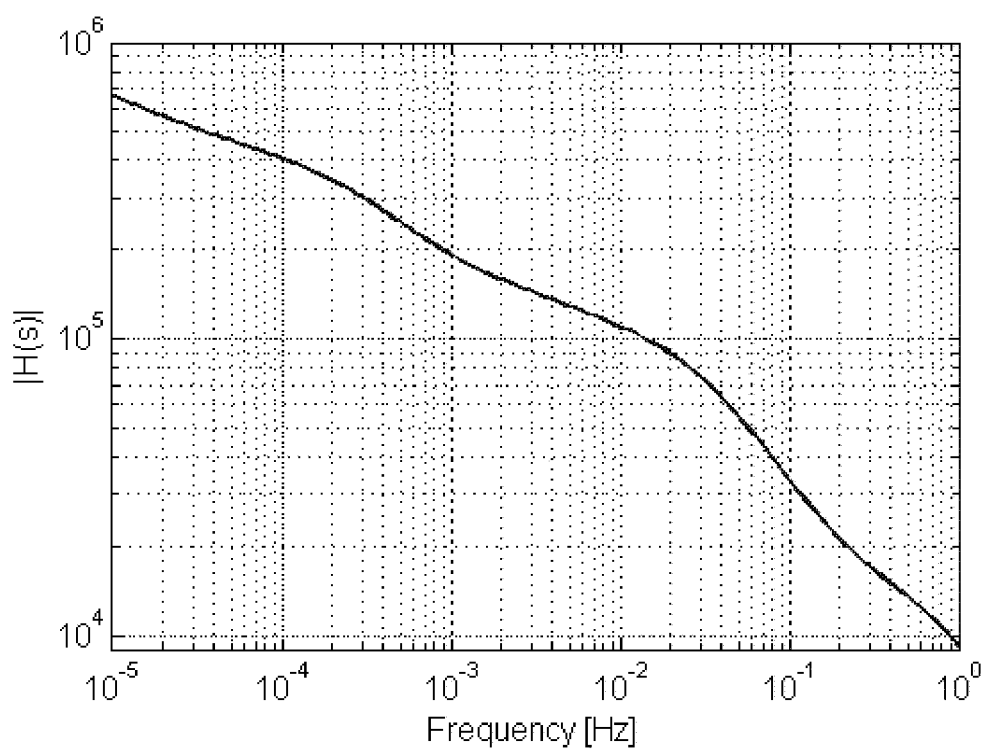
FIG. 5 show magnitude of Ontario earth transfer function versus frequency when the entire province is represented based on a uniform model.
Figure 6:
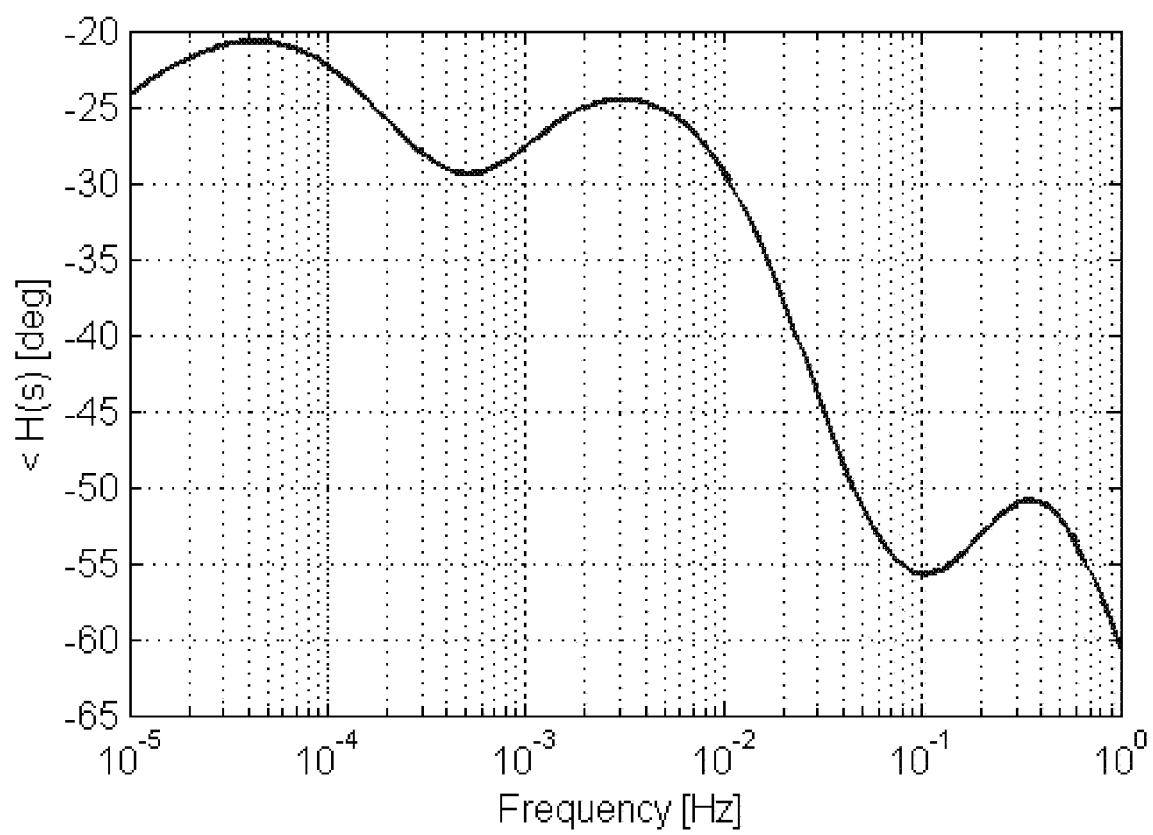
FIG. 6 shows phase angle of Ontario earth transfer function versus frequency when the entire province is represented based on a uniform model.

In some cases, the entire geographical area of the power system can be represented by an average earth structure, assuming that such an average structure is uniform within the entire area. In such a case, the entire area under examination is represented by a uniform (single-zone) model having average frequency domain characteristics. FIGS. 5 and 6, respectively, show the magnitude and the phase angle of Ontario earth transfer function versus frequency when the entire province is represented based on a uniform model. Due to frequency dependency of the earth transfer function, the intensity of the GIC is generally frequency dependent and its magnitude tends to increase as the frequency of the magnetic field decreases, illustrated in FIG. 5. Variation of the phase angle is generally not monotonic; however, it represents an overall resistive-inductive characteristic.

Figure 7:
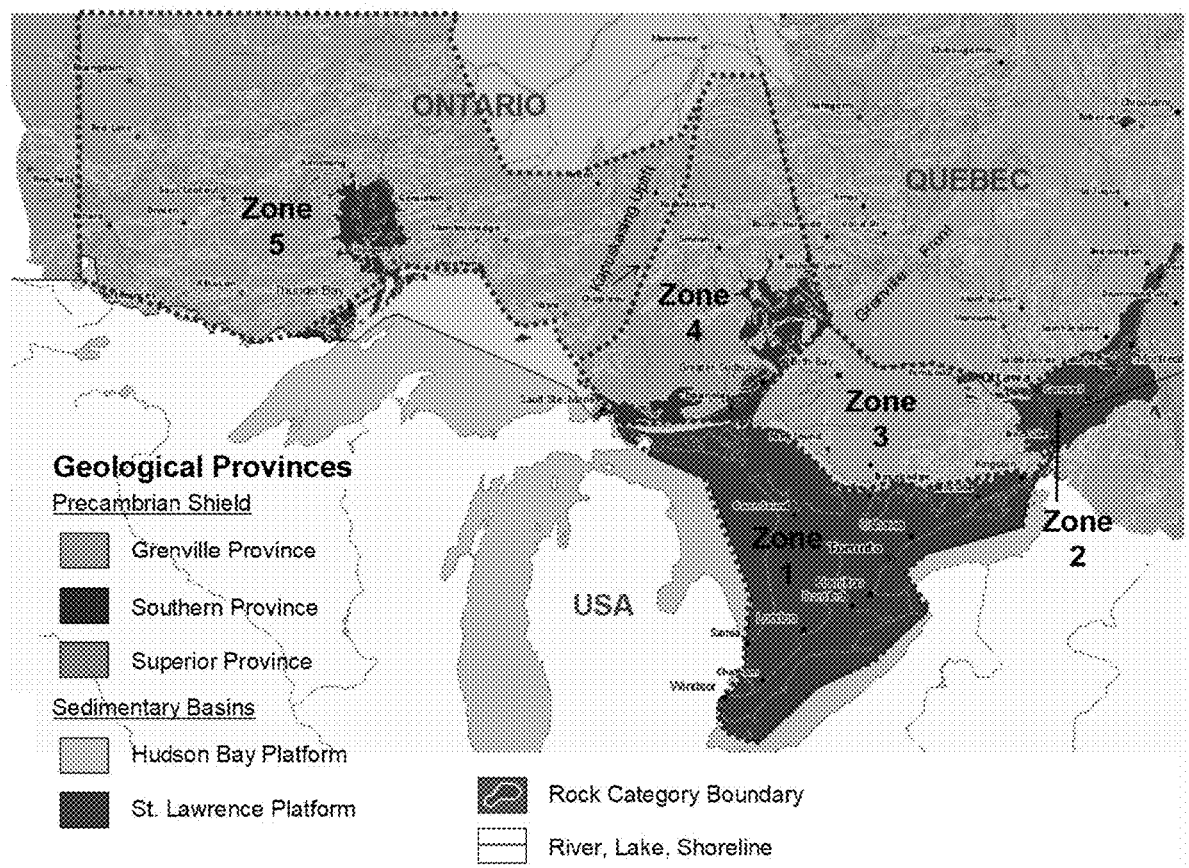
FIG. 7 shows an example of five distinct geological zones with different earth structures for Ontario.
Figure 8:
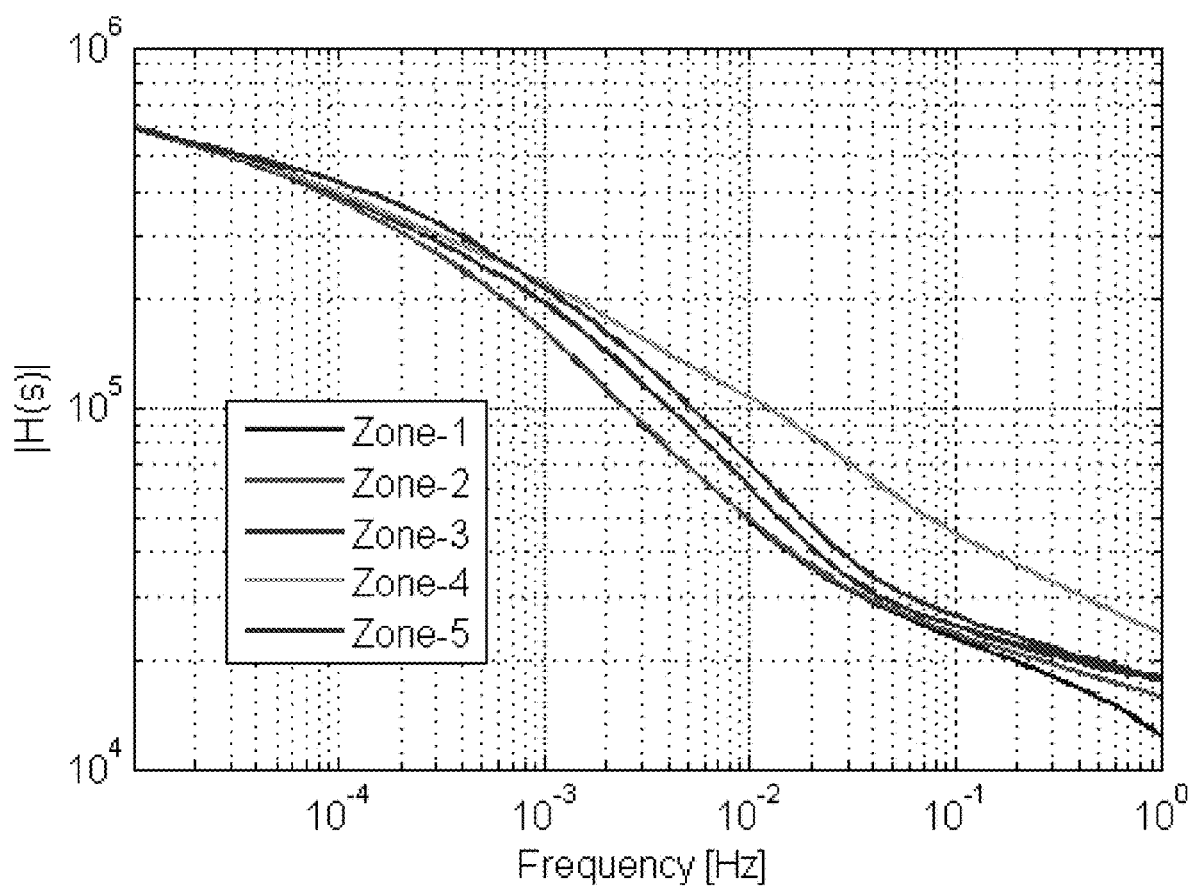
FIG. 8 shows magnitudes of five zones forming an Ontario multi-zone earth model.
Figure 9:
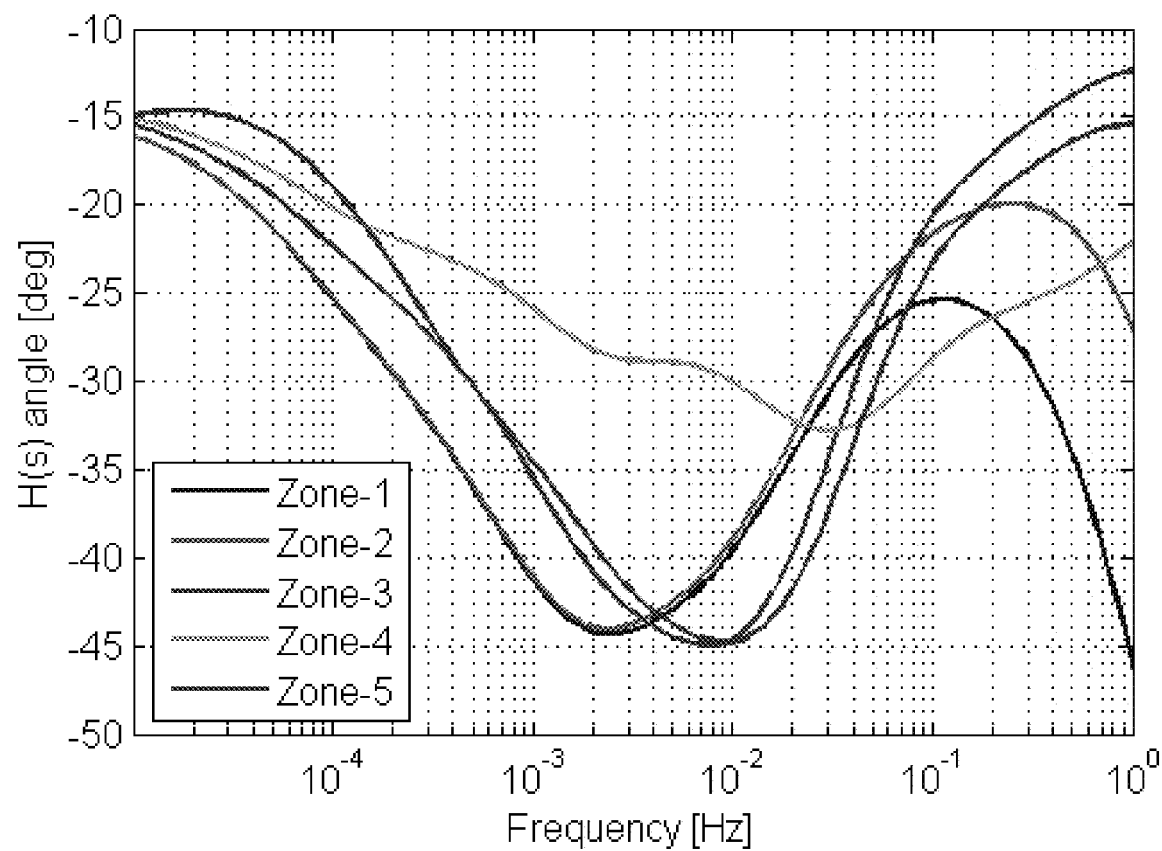
FIG. 9 shows phase angles of five zones forming an Ontario multi-zone earth model.

A more realistic earth model can be constructed based on different soil properties of the geographical zones embedding the power system. Consequently, a non-uniform (multi-zone) earth model can be formed with each zone modeled by a multi-layer soil structure of FIG. 4. For Ontario, the geological studies have identified five distinct geological zones with different earth structures, as shown for example in FIG. 7. FIGS. 8 and 9, respectively, depict the magnitudes and phase angles of these five zones forming the Ontario multi-zone (non-uniform) earth model. FIGS. 8 and 9 clearly show noticeably different responses of the five zones to the magnetic field disturbance. FIG. 9 reveals that at about 10 mHz, the geoelectric field generated in Zone-5 is more than twice of those of Zone-1 and Zone-2.

To mitigate the impacts of GMD on power system, approaches can be classified into two main groups. The first group includes the mitigation approaches that can be applied in the power system planning stage. These approaches generally involve installation of GIC blockers to prevent flow of GIC in power system. Therefore, the mitigation approaches of this group require high capital investment; thus, electric power utilities generally prefer to minimize such approaches. The second group of mitigation approaches include operational measures, such as system topology changes and switching maneuvers that are conducted by operators in the power system control rooms. In addition to flexibility to accommodate various operational constraints, these approaches are not as costly.

To have clear insight into the feasibility of real-time GMD monitoring and mitigation by the power system operators, two factors can be used to determine the available time of the operators to make a technically wise decision on what type of the operational action should be pursued. One of the factors is imposed by the disturbance natural behavior and how fast it varies, and the second factor is the required system computational burden.

Figure 10:
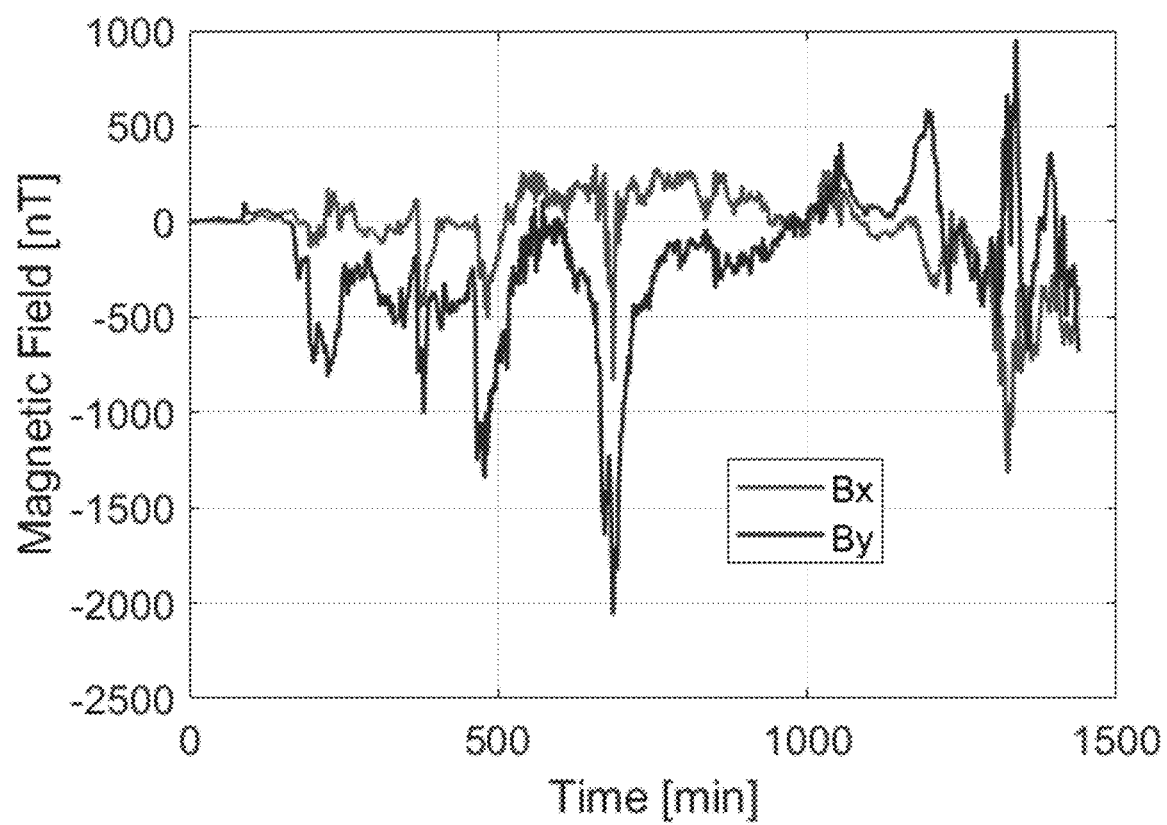
FIG. 10 illustrates measured magnetic field disturbance during an event on Mar. 13, 1989 that resulted in Hydro-Quebec power system blackout.
Figure 11:
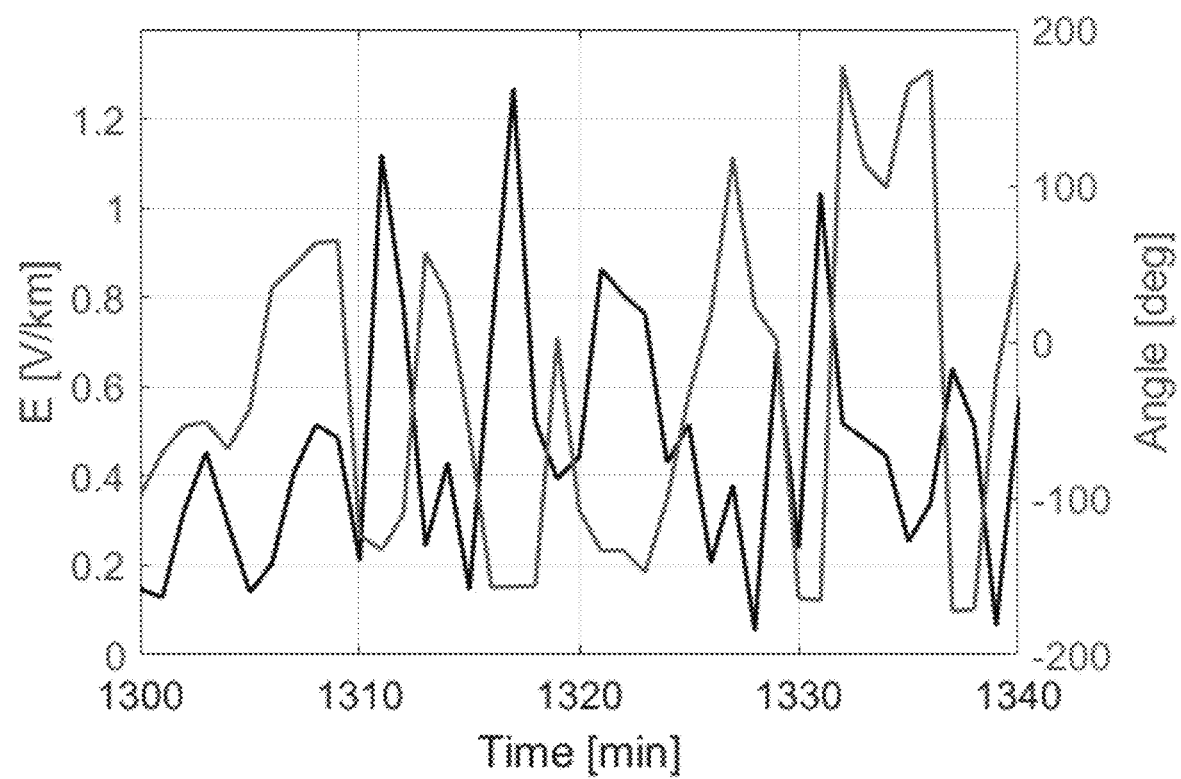
FIG. 11 illustrates geoelectric field during the event on Mar. 13, 1989 that resulted in Hydro-Quebec power system blackout.

FIGS. 10 and 11, respectively, illustrate the measured magnetic field disturbance and the resultant geoelectric field during an event on Mar. 13, 1989 that resulted in Hydro-Quebec power system blackout. FIG. 10 shows the variations of the magnetic field components x (eastward) and y (northward) for entire 24 hours (1440 min) of the day. Although the highest magnetic field variation happens around t=700 minute, the most severe disturbance occurred slightly after t=1300 minute, as the rate of change of the magnetic field is the highest at this time. A close look at the geoelectric field E shows that it can reach the peak intensity from a moderate level within less than a minute, and this is typical for other observed GMDs in other past data. FIG. 11 also shows that the direction of E, with respect to East direction, sporadically changes with time. As a result, the operator time for detection of the high GIC flows in the system is less than one minute and no prediction can be reasonably made in advance.

Figure 12:
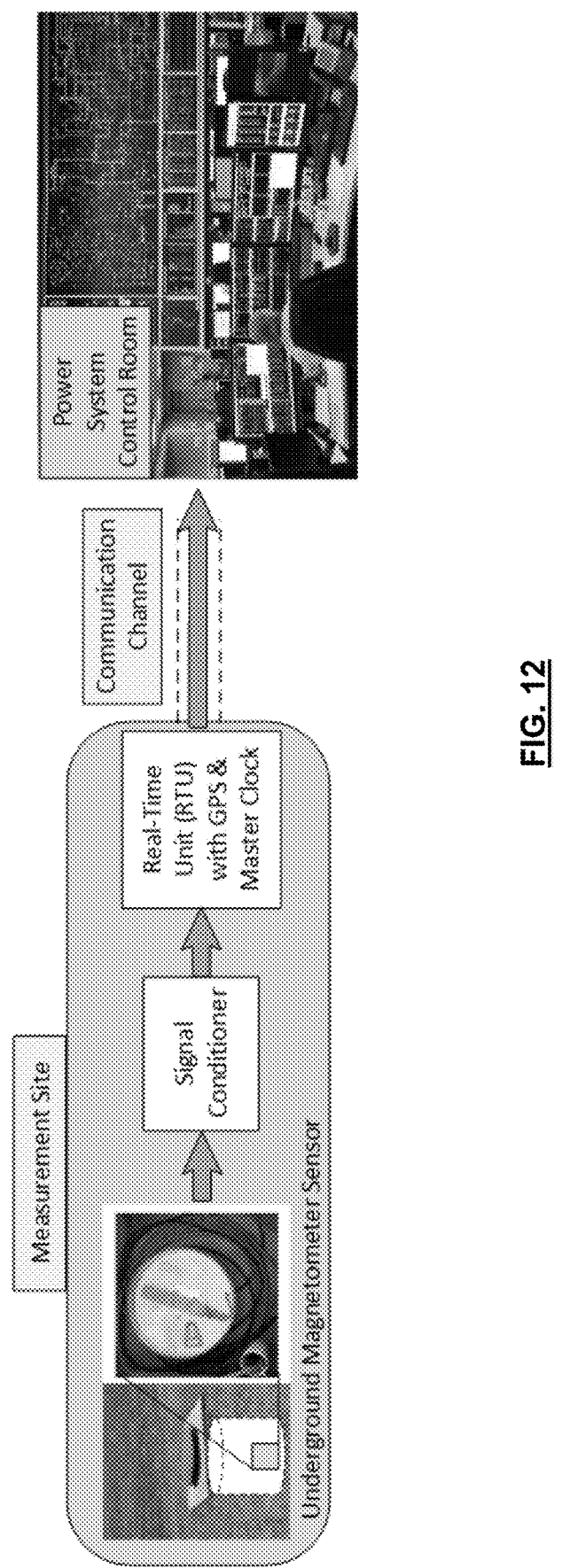
FIG. 12 illustrates an example of a typical measurement site and hardware for collecting and transferring data to the control room.

For real-time calculation of the geoelectric field and the resultant GIC flows in a power system, the earth magnetic field can be measured and communicated to a control room in real-time. FIG. 12 illustrates an example of a typical measurement site and the main required hardware for collecting and transferring data to the control room. The earth magnetic field is measured by a 3-dimensional magnetometer sensor 106 installed at a depth of, for example, 1 m-1.5 m underground. With a waterproof enclosure, such an underground installation provides more thermally stable ambient for the sensor and to some extent makes it less sensitive to the outside interfering objects. The sensor can be installed on an adjustable tripod in the enclosure for alignment with the earth magnetic poles and its measured signal is sent to signal conditioner for noise removal and signal amplification. The output magnetic field signals of the signal conditioner are generally analog which are sent to real-time unit (RTU) to convert to digital signals, buffer and finally transmit to the power system control room via a communication channel. RTU can also be equipped with global positioning system (GPS) and a master clock for time synchronization and time stamping the measurement samples.

For determining GMD vulnerability, it can be useful to find the maximum GIC magnitude and the corresponding geoelectric field angle at which the maximum GIC flow occurs. In a uniform earth model, all parts of the earth respond to the magnetic field change, similarly. Although the earth transfer function is frequency dependent, the GIC magnitude of all parts of the power system are obtained based on the same characteristic, such as FIG. 5. If the geoelectric field is taken as the known quantity, the GICs in the system are scaled with the geoelectric field magnitude. Furthermore, the uniform earth model requires that the GICs flowing in all parts of the system and equipment are in phase, at any frequency of interest, as obtained from FIG. 6. Thus, the numerical manipulations with GIC quantities can be carried out based on scalar quantities while ignoring the GIC phase angles.

Figure 13:
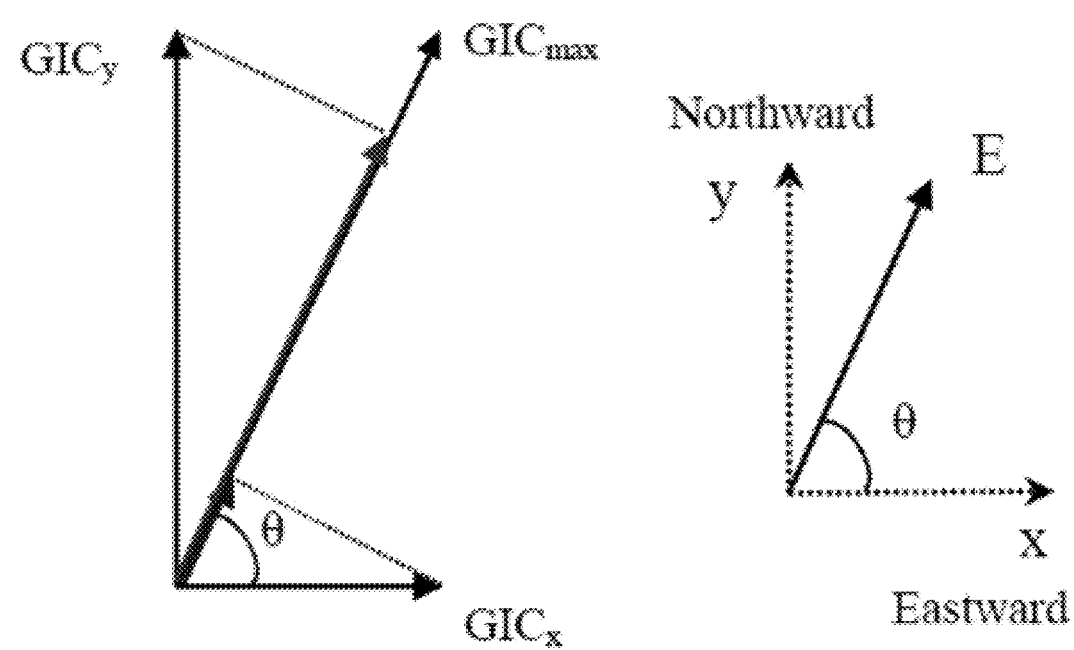
FIG. 13 shows a vector diagram of two orthogonal GIC solutions and a resultant maximum GIC with a uniform earth model.

Due to the scalability of the GIC results with E, generally the maximum GIC flow is determined for a given geoelectric field intensity; for example, 1 V/km. For the purpose of GIC determination with a given geoelectric field, the power system can be represented as a direct current network, and the induced geoelectric fields obtained from the uniform earth model. Consequently, the overall system is a linear and frequency-independent system. For a power system with the given equipment parameters, generally the only variable affecting the GIC magnitude is the geoelectric field direction or the geoelectric field angle. The final network solution is obtained from the superposition of the system responses to the two orthogonal excitation components, as shown in FIG. 13. Thus, only two system solutions are sufficient to find the maximum GIC flows in all system equipment.

FIG. 13 shows a vector diagram of two orthogonal GIC solutions and the resultant maximum GIC in the uniform earth model. FIG. 13 includes two perpendicular directions West-East and South-North, hereafter referred to as x and y directions respectively, to decompose the geoelectric field with taking x direction as the reference for the geoelectric field angle. The components of the geoelectric field E in x and y directions are $E_x$ and $E_y$, respectively. $GIC_x$ and $GIC_y$ are assumed to be the solutions of a quantity of interest, such as a transformer GIC, when the system is subjected to the electric field $E_x$ and $E_y$, respectively. The quantity of interest can be the GIC flow in any transformer, line or ground grid of a substation of interest.

Since the power system is generally linear, $GIC_x$ and $GIC_y$ are proportional to $E_x$ and $E_y$, respectively. The final determination can be based on the superposition of the two solutions. Therefore, when the power system is subjected to the electric field E with angle θ, the GIC is determined as:

$$GIC(\theta) = GIC_x \cos(\theta) + GIC_y \sin(\theta) \quad (1)$$

The maximum magnitude of GIC, i.e., $GIC_{max}$, and the associated geoelectric field orientation and/or direction, $\theta_{max}$, at which the $GIC_{max}$ occurs are obtained by setting derivative of Equation (1) with respect to e to zero:

$$\theta_{max} = \tan^{-1}\left(\frac{GIC_y}{GIC_x}\right), \quad (2)$$

and $$GIC_{max} = \sqrt{GIC_x^2 + GIC_y^2} \quad (3)$$

Equations (2) and (3) can be applied to both spatially distributed elements such as transmission lines and lumped elements such as transformers. Furthermore, Equations (2) and (3) can also be applied for finding the maximum GIC flow in any section or parts of an equipment; for example, the GIC flow in the series winding of an autotransformer of interest.

Unlike the uniform earth model, in the multi-zone (non-uniform) earth model, the transfer function and therefore the induced voltages of the zones are different in magnitude and phase angle, and both of these quantities are frequency dependent. Each GMD event can have its own characteristic and/or signature. However, around the event peak activity, a dominant frequency can be extracted from the magnetic field waveform. When the dominant frequency is known, the magnitude and angle of the induced voltage or geoelectric field can be determined for each geological zone, according to the transfer function characteristics; similar to those depicted in FIGS. 6 and 7 for Ontario.

Figure 2:
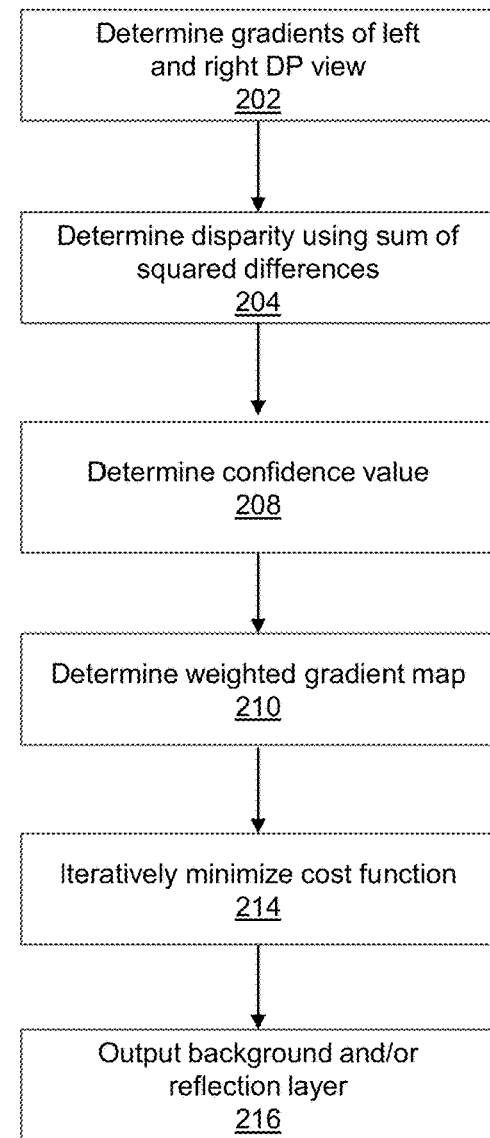
FIG. 2 is a flowchart of a method for geomagnetic disturbance determination for power systems, in accordance with an embodiment.

FIG. 2 is a flow chart for a method for geomagnetic disturbance determination for power systems 200, according to an embodiment. Similar to the uniform earth model, in the non-uniform model, it is computationally more efficient to find the maximum GIC based on two orthogonal solutions. Nevertheless, in the multi-zone system, finding the extremum of the resultant function is more complicated. At block 202, the measurement module 150 receives the sensor data from the one or more sensors 106 comprising an electric field experienced by one or more portions of the power system. In some cases, the sensors can be magnetometers which measure the Earth magnetic field, usually in three dimensions, outputting measurements of the magnetic field in nano-Tesla (nT). In the multi-zone model, the determination module 152 determines $GIC_x$ and $GIC_y$ based on an appropriate approach; such as a piecewise layered earth modeling approach. $GIC_x$ and $GIC_y$ can not only be different in magnitude but can also represent different phase angles due to the different transfer functions of the geological zones. Thus, in the non-uniform earth model approach, $GIC_x$ and $GIC_y$ are vector quantities rather than scaler. This results in a set of equations to be solved to find the maximum GIC.

Similar to the single-zone earth model, the maximum GIC can be determined according to the projection of the x and y field directions, as exemplified in FIG. 13. At a given frequency of interest ω, the calculated $GIC_x$ and $GIC_y$ can be represented by phasors $I_x\angle\varphi_x$ and $I_y\angle\varphi_y$, respectively. Phasors represent a magnitude and a phase angle of sinusoidal variations of the corresponding quantities. In an example, for phasor $I_x\angle\varphi_x$, $I_x$ is the magnitude of the current in x-direction and $\varphi_x$ is its phase angle.

At block 204, the determination module 152 can determine a total GIC by determining:

$$GIC(t, \theta) = I_x\cos(\omega t + \varphi_x)\cos(\theta) + I_y\cos(\omega t + \varphi_y)\sin(\theta) \quad (4)$$

Thus, the GIC in the multi-zone earth structure is a multi-variable function. At block 206, the determination module 152 can determine a maximum magnitude of GIC and determine a corresponding direction by setting a gradient of the two-variable function GIC(t,θ) to zero:

$$\nabla GIC = \left(\frac{\partial GIC}{\partial t}, \frac{\partial GIC}{\partial \theta}\right) = (0, 0) \quad (5)$$

This results in the following set of expressions to be solved for the two unknowns:

$$\begin{cases} I_x\cos(\omega t + \varphi_x)\sin(\theta) - I_y\cos(\omega t + \varphi_y)\cos(\theta) = 0 \\ I_x\sin(\omega t + \varphi_x)\cos(\theta) + I_y\sin(\omega t + \varphi_y)\sin(\theta) = 0 \end{cases} \quad (6)$$

The determination module 152 can solve the set of Equations (6). At block 208, the determination module 152 can determine corresponding critical solution point ($t_{max}$, $\theta_{max}$) to check whether or not the solution point is an actual extremum point. This is due to the fact that in a multi-variable function, both extremum and saddle points result in zero gradient. The discrimination between the two can be found by the determination module 152 by determining Hessian matrix, H, to determine the characteristics of the critical point:

$$H(t, \theta) = \begin{bmatrix} \frac{\partial^2 GIC}{\partial t^2} & \frac{\partial^2 GIC}{\partial t \partial \theta} \\ \frac{\partial^2 GIC}{\partial \theta \partial t} & \frac{\partial^2 GIC}{\partial \theta^2} \end{bmatrix} \quad (7)$$

The determined critical point is a maximum point if it satisfies:

$$\det H(t_{max}, \theta_{max}) > 0 \quad (8)$$

In some cases, at block 210, if a global maximum point is desired, the determination module 152 can also determine an angular frequency ω by adding it as the third unknown parameter in Equation (5), and the equations can be solved for the three unknowns. In some cases, frequency may be preferred to serve as an input parameter obtained from the observed behavior of the geoelectric field; for example, 2.78 mHz obtained from FIG. 11.

Angular frequency or simply frequency of the Earth magnetic variation is a parameter which depends on the GMD event and can be estimated from the measurements. In some cases, this can be important because the response of the ground layers is different at various frequencies. In this way, induced voltage in the ground can be frequency dependent; and thus, to find the GIC flow in the power systems, the frequency from input data is to be obtained. As the frequency is obtained from the input data, the system 100 has two unknowns (tmax, θmax) in Equation 6; and with having two equations, the system 100 can the unknowns based on, for example, a nonlinear iterative solution (for example, Newton-Raphson approach).

At block 212, the output module 154 outputs the determined maximum GIC magnitude and the corresponding geoelectric field direction (or corresponding angle) at which the maximum GIC occurred. This can be used, for example, to determine GMD vulnerability.

By comparing the maximum GIC with associated withstand capabilities of one or more elements of the power system, the system 100, or system operator, can identify the elements at risk of failure and take a remedial action. In most cases, the remedial action is topology dependent and can be different from one power system to another. In some cases, based on the identified GIC magnitude, the system 100 can also determine reactive power losses of transformers; and thereby, a voltage regulation problem in an entire power system can be simulated. In this way, low voltage areas of the power system can be identified and, if the voltage drop is severe, it can indicate the risk of voltage collapse and power system blackout.

In example experiments, the present embodiments were validated using a simulation involving the multi-zone earth model of Ontario with an overlaid transmission system. In the example experiments, the earth model with the geographical zones of FIG. 7 and the transfer function characteristics of FIGS. 8 and 9 were used. The present embodiments were applied on the Ontario power transmission system, including about 530 power transformers and more than 800 transmission circuits. The power system is represented by a corresponding direct-current (dc) network based on typical dc resistances of the transformers, transmission lines, and substation ground grids, respectively assumed to be 0.20/phase for transformers, 0.0640/km for 230 kV lines and 0.0130/km for 500 kV transmission circuits, and 0.20 for the substation ground grids. The dc network was solved using a nodal solution approach for the bus dc voltages as:

$$[V]=[G]^{-1}[I] \quad (9)$$

where [V] denotes the nodal bus voltages, [G] is the conductance matrix, and [I] is the nodal Norton equivalent current matrix resulting from the induced voltages. With the known nodal voltages, the GIC flow in all system equipment can be determined.

In the example experiments, the approach of the present embodiments was applied to the Ontario power transmission system with 1013 transmission buses and the results were compared with those of the angle sweep method. In the angle sweep method, to cover/sweep all directions and due to the symmetry, the geoelectric field orientation within the range of 0 to 180 degrees is simulated with the angle step change of 1-degree. Based on the obtained dc voltages, the GIC flows in transformers, lines and substation ground grids were determined. The results were used to evaluate the power system to identify vulnerable equipment carrying the highest GIC flows. Generally, a smaller sweep angle step change yielded more precise results, but significantly increased processing time.

TABLES 1, 2, and 3, respectively, present the highest GIC flows in transformers, transmission circuits, and substation ground grids. TABLES 1, 2, and 3 also compare the simulation results obtained from the present embodiments and the angle sweep method. The simulations are performed at the GIC frequency of 1 mHz with the base geoelectric field magnitude of 8 V/km in Zone-1 of FIG. 7. The results show the accuracy of the present embodiments for finding the maximum GIC flow and the corresponding geoelectric field angle. In some cases, the present embodiments can determine the maximum GIC and the corresponding geoelectric field angle to excellent decimal point precision.

TABLE 1

| Trans-former | Maximum GIC magnitude (A) | | Maximum GIC angle (degree) | |
|---|---|---|---|---|
| | Present Embodiments | Angle sweep method dθ = 1-deg | Present Embodiments | Angle sweep method dθ = 1-deg |
| T293 | 180.092 | 179.376 | 163.689 | 163 |
| T294 | 180.092 | 179.376 | 163.689 | 163 |
| T410 | 168.064 | 168.064 | 93.7996 | 94 |
| T263 | 157.144 | 157.129 | 114.075 | 114 |
| T229 | 149.253 | 149.248 | 139.379 | 139 |
| T4 | 148.958 | 148.944 | 56.554 | 57 |
| T477 | 142.838 | 142.831 | 32.494 | 32 |
| T478 | 142.838 | 142.831 | 32.494 | 32 |
| T350 | 142.627 | 141.929 | 95.442 | 95 |
| T80 | 140.851 | 140.828 | 131.472 | 131 |

TABLE 2

| Trans-mission Line | Maximum GIC magnitude (A) | | Maximum GIC angle (degree) | |
|---|---|---|---|---|
| | Present Embodiments | Angle sweep method dθ = 1-deg | Present Embodiments | Angle sweep method dθ = 1-deg |
| L531 | 513.898 | 513.891 | 93.623 | 94 |
| L214 | 479.393 | 479.382 | 102.361 | 102 |
| L65 | 389.064 | 389.057 | 13.0937 | 13 |
| L66 | 388.608 | 388.115 | 13.0937 | 13 |
| L830 | 366.768 | 366.767 | 111.136 | 111 |
| L831 | 366.768 | 366.767 | 111.136 | 111 |
| L834 | 307.356 | 307.285 | 14.4913 | 15 |
| L835 | 307.810 | 307.038 | 14.4913 | 15 |
| L69 | 303.573 | 303.212 | 162.668 | 162 |
| L71 | 303.573 | 303.212 | 162.668 | 162 |

TABLE 3

| Substation | Maximum GIC magnitude (A) | | Maximum GIC angle (degree) | |
|---|---|---|---|---|
| | Present Embodiments | Angle sweep method dθ = 1-deg | Present Embodiments | Angle sweep method dθ = 1-deg |
| S24 | 2153.81 | 2152.54 | 139.325 | 139 |
| S96 | 1701.96 | 1699.58 | 142.373 | 142 |
| S122 | 1557.30 | 1555.917 | 99.826 | 100 |
| S95 | 1328.90 | 1325.857 | 42.710 | 43 |
| S118 | 1136.59 | 1132.815 | 113.428 | 114 |
| S101 | 1065.51 | 1063.396 | 49.187 | 49 |
| S40 | 1059.71 | 1054.065 | 28.785 | 29 |
| S25 | 926.871 | 927.601 | 140.611 | 141 |
| S167 | 889.842 | 899.797 | 9.820 | 10 |
| S171 | 857.026 | 856.989 | 32.49 | 32 |

The simulation results of TABLES 1, 2, and 3 illustrate that the present embodiments have higher accuracy and significantly higher performance than the angle sweep method. While the angle sweep method takes 15-minutes and 38 seconds on a computer with 3 GHz-CPU, GB-RAM, the present embodiments take only 3 sec to find the maximum GICs and the associated phase angles in the entire Ontario transmission system. This makes the present embodiments an advantageous approach in real-time applications, and for intense calculations with high number of simulations; for example, as generally required for optimization of power system operation during GMDs.

Due to frequency-dependent nature of the earth, the magnitude and phase angle of the induced geoelectric field is frequency-dependent; as exemplified in the characteristics of FIGS. 8 and 9. Therefore, for GMD vulnerability assessments under steady-state power system operation, the frequency of the geoelectric field can be an input parameter. Thus, in some cases, the approach can take into account the frequency range of GIC which can be assumed to be 0.1 mHz to 0.1 Hz.

Figure 14:
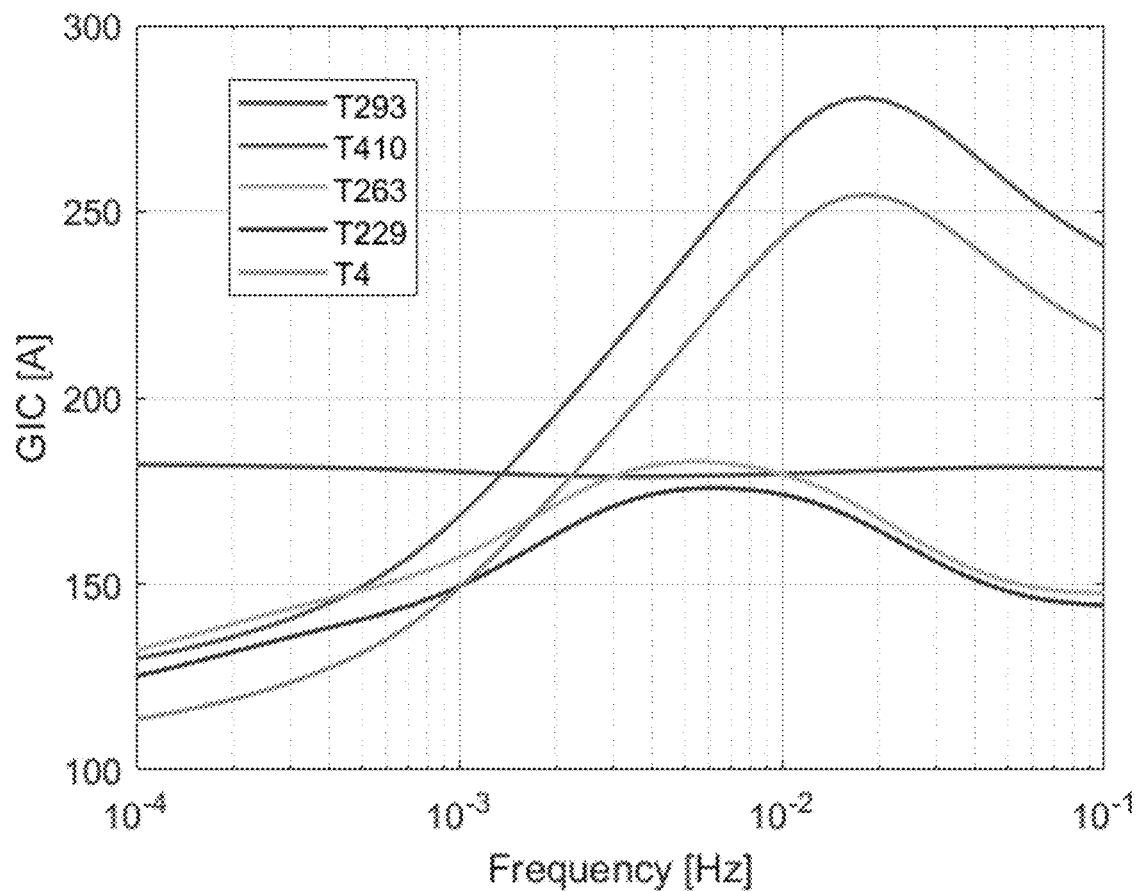
FIG. 14 illustrates example variations of GIC in a few vulnerable transformers as a function of GIC frequency.
Figure 15:
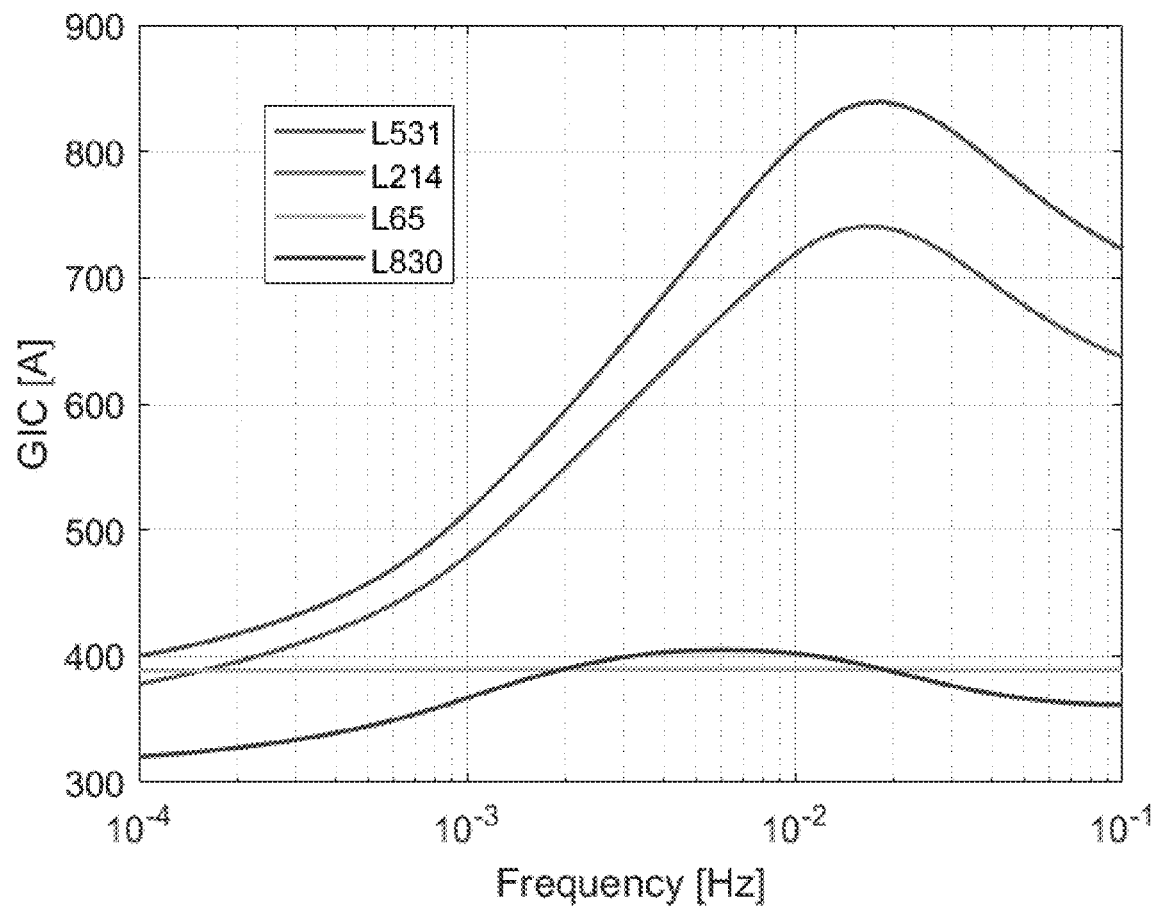
FIG. 15 illustrates example variations of GIC in a few vulnerable transmission lines as a function of GIC frequency.

FIGS. 14 and 15 illustrate example variations of GIC in a few vulnerable transformers and transmission lines as a function of the GIC frequency. In this example analysis, the base geoelectric field of 8 V/km is assumed in Zone-1 at all frequencies, and the geoelectric field of the other zones are obtained from the characteristics of FIGS. 8 and 9. Due to different responses of the other zones, the geoelectric fields applied on power system in different areas are different. According to FIG. 8, Zone-5 at frequencies lower than 1 mHz, and Zone-4 at higher frequencies, generate the highest geoelectric fields. The overall behavior of the Ontario multi-zone structure results in the increase of the GIC magnitudes in the vulnerable transformers and transmission lines up to about 0.02 Hz. Furthermore, the order of the ranked equipment carrying high GIC is changed with the frequency, as shown in FIGS. 14 and 15. For instance, although T293 is identified in TABLE 1 as the transformer with the highest GIC at 1 mHz, the frequency scan of FIG. 14 represents it as the 4$^{th}$ highest in the frequency range of 3 mHz-10 mHz with significant increase of the GICs in transformers T410 and T4. Such frequency scans provide useful indications of the GIC amplification in power systems as a function of frequency.

Advantageously, the present embodiments provide a fast analytical approach for identifying vulnerable power system areas to GIC. Vulnerability can be assessed based on the high GIC carrying power equipment during a GMD. In some embodiments, two-orthogonal-fields approaches have been extended to a multi-zone earth model. The approach of the present embodiments has been applied to Ontario transmission system including 230 kV and 500 kV voltage levels in example experiments. The results of such example experiments have been validated based on the results of the angle sweep method which is a time-consuming but widely used approach. The numerical results reveal that not only are the present embodiments more accurate but also significantly faster than the angle sweep approach. Comparing the present embodiments and the angle-sweep approach, the superior performance of the present embodiments has been well demonstrated by solving the entire Ontario transmission system consisting of 1013 high-voltage transmission buses. While the angle sweep method takes 15-minutes and 38 seconds on a computer with 3 GHz-CPU, 32 GB-RAM, the present embodiments take only 3 sec to find the maximum GICs and the associated phase angles in more than 500 transformers, about 800 transmission circuits, and about 200 transmission substation ground grids. Accordingly, the present embodiments are demonstrably better suited for real-time applications. Furthermore, even in offline studies where intense calculations with numerous simulations are required, such as the optimization of power system operation during GMDs, the present embodiments can significantly increase the overall performance.

In further embodiments, the impacts of GMD on a wind farm and its main output transformer (MOT) are provided. In these embodiments, a harmonic analysis can be performed in time-domain with detailed modeling of the doubly fed induction generators (DFIG) and the corresponding power electronic converters and controls. Example experiments using simulation show high levels of harmonics injected into the wind farm due to saturation of main output transformer (MOT) during the GMD. A moderate neutral GIC of 37 A, i.e., about 12.3 A/phase, is high enough to expose the DFIGs to a high harmonic distortion beyond the standard limit of 5%. The present inventors determined that, in some cases, even harmonic filters can be employed to reduce the harmonic levels. In some cases, a GIC blocking device (BD) can completely mitigate the harmonics.

Figure 16:
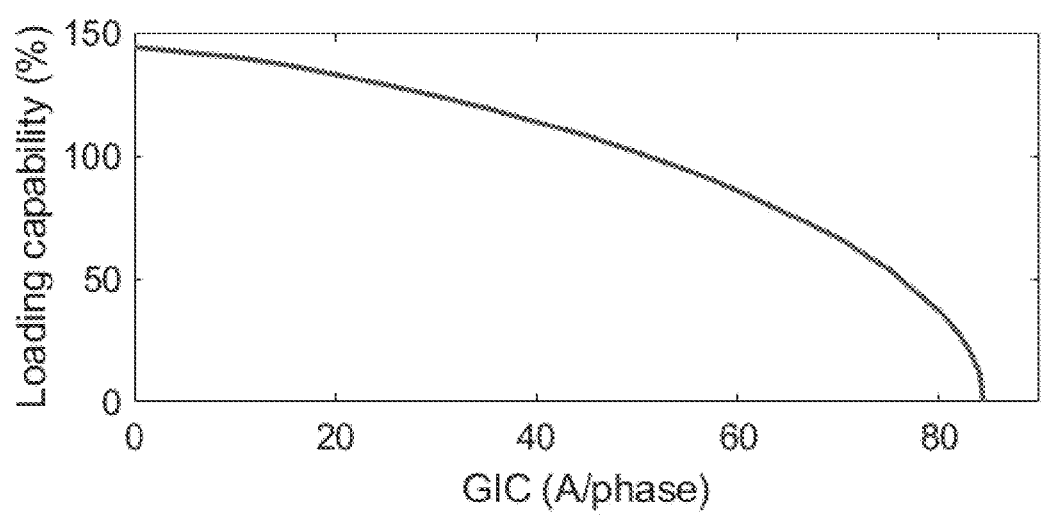
FIG. 16 shows a capability curve, according to an embodiment, of a main output transformer (MOT) as a function of per phase GIC with a loading capability represented as a percentage of a MOT rated power.

A thermal assessment of MOT was also conducted by the present inventors to investigate the vulnerability of the MOT to hotspot heating due to GIC. In this example experiment, a wind farm was simulated under the GIC benchmark waveform conditions with various peak values up to 100 A/phase. The simulation results reveal that the MOT winding hotspot exceeds the maximum permissible limit of 180° C. at 70 A/phase which is less than the minimum problematic GIC of 75 A/phase. Due to the hotspot heating concern, the present inventors developed a loading capability curve for the MOT for safe operation of the wind farm through a GMD event. Based on the winding temperature limit of 180° C., the loading capability curve can be used for the MOT to account for the temperature rises due to the normal loading and the GIC. FIG. 16 shows the capability curve of the MOT as a function of the per phase GIC with the loading capability represented as the percentage of the MOT rated power, i.e., 50 MVA. FIG. 16 shows that for the safe operation of the MOT subjected to the neutral GIC of 200 A, the wind farm generation should be reduced to 73% of the MOT rating. For the experimental system, the wind farm is readily rated 72% of the MOT rating thus properly rated below the maximum capability of the MOT. This ensures that the wind farm can still deliver its rated generation to power grid under the neutral GIC of 200 A without posing overheating concern on the MOT. However, for higher wind farm ratings, a generation reduction is necessary, according to the loading capability curve of FIG. 16.

In further embodiments, temperature distribution and oil flow in bushings of transformers was determined by the present inventors to ensure safe and reliable operation under various loading conditions. In the approach of such embodiments, a determination of a hot spot temperature (HST) of oil impregnated paper (OIP) bushings is performed based on the finite element method (FEM)-modified thermal equivalent circuit (TEC) model. To deal with accuracy issues of TEC models, nonlinear characteristics of the resultant convection thermal resistances can be obtained. In order to find such characteristics, the temperature pattern, and fluid velocity in the bushing can be modeled by FEM. The results reveal that in the absence of convective resistances, a significant difference can be observed between TEC and FEM results, for instance 74.5° C. at 2 pu loading. In addition, the effects of different parameters such as load current, transformer top oil temperature (TTOT), and oil flow on HST were determined by the present inventors. Using simulation, it was determined that TTOT noticeably influences the HST and the temperature distribution on the bottom of bushing, due to the proximity to the transformer top oil. The HST nonlinearly varies with TTOT and for example a decrease of 30° C. in transformer oil temperature results in a HST decrease of 24° C. However, the temperature distribution in the top part of the bushing is not affected by the TTOT due to the effects of ambient temperature and high convection rate in that area. In addition, it was determined that the oil flow in the top of bushing has high velocity compared with the bottom of bushing, and this leads to better heat dissipation and a temperature drop of more than 10° C. in some parts of the bushing top portion. Furthermore, at higher load currents, or with lower TTOT which causes higher temperature difference between the walls of oil, the oil flow velocity increases and more heat is transferred to the ambient by convection. At the rated current, the HST is located on the conductor near the flange and the temperature rise is less than the recommended temperature rise by the IEEE standard C57.19.00. However, the example experiments show that the HST exceeds the permissible limits when the bushing is overloaded during the transformer overloading conditions. For the studied bushing, only 4% overloading is high enough to push the HST beyond the permissible limit. This implies that bushing is a vulnerable part of the transformer from transformer overloading point of view and the resultant HST can adversely affect the bushing lifetime. Consequently, it was determined that it may be necessary to take into account the overload capability of bushing when power utilities plan to overload their transformers.

As described herein, several observatory sites around the world measure magnetic field, B, on the earth's surface. Wide-area monitoring of B provides input data, i.e., B and dB/dt, to multilayer earth models to subsequently calculate the geoelectric field. In some cases, accuracy of the GIC determinations can be improved by improving the quality of B signals. Analysis of offline data provided by a network of observatories revealed that some of the recorded B signals are affected by a significant noise level as well as several spikes. The noises and spikes are amplified in the dB/dt time derivative that is used to calculate the induced electric field and the resultant GIC; used as input to the earth models. Consequently, the fluctuations manifest themselves in the calculated GIC magnitudes.

Embodiments of the present disclosure can also include denoising and despiking the B signals, for example, prior to differentiation. Having an appropriate method to take derivative of the B signal can be highly beneficial due to the significant effect that it has on signal to noise ratio (SNR) of dB/dt. In this regard, different methods of differentiation were assessed. Although the B signal can be sampled at 1 second intervals, other intervals can be used in view of any practical limitations. Example experiments were conducted to analyze the effectiveness of the method 1700 by calculating GICs in a modified IEEE 118-bus test case.

Magnetic flux density B can be measured continuously on earth's surface at several observatories around the world. In some cases, the B signal can be measured in x, y, and z directions at a maximum frequency of 1 Hz. In an example, recorded magnetic flux density data for different observatories have been extracted from the global network of observatories INTERMAGNET. Example experiments use B signals that pertain to a GMD event on 2015 Aug. 15.

The signals recorded by the magnetometers include environmental noises similar to the other field measurements. On the other hand, time derivative of the B signal is generally applied instead of the B amplitude in the GIC determinations since the electric field is induced due to the changes in the magnetic field. Taking the derivate amplifies the noises, and therefore, the noises in the B should be reduced to an acceptable level prior to the differentiation.

The measurement module 150 receives the signals from the sensors 106 (magnetometers). The measurement module 150 decomposes the signals down to the fourth level using sym4 wavelet. Ultimately, the wavelet coefficients are shrunk, and the signal is reconstructed afterwards. For the example experiments, SNR is considered as a criterion to evaluate effectiveness of denoising. SNR value is calculated for both $B_x$ and its numerical derivative $dB_x/dt$ for three stations, and the results are shown TABLE 4. Although SNR value is maintained at the same level for the $B_x$, a noticeable reduction in the noise level is evident for the derivative signal.

TABLE 4

| Station | SNR of $B_x$ | | SNR of $dB_x/dt$ | |
| --- | --- | --- | --- | --- |
| | Original | Denoised | Original | Denoised |
| Yellowknife | 4.29 | 4.29 | −23.53 | −9.26 |
| St John's | 12.98 | 12.98 | −18.98 | −15.97 |
| Sitka | 1.34 | 1.34 | −21.16 | −9.42 |

Figure 18A:
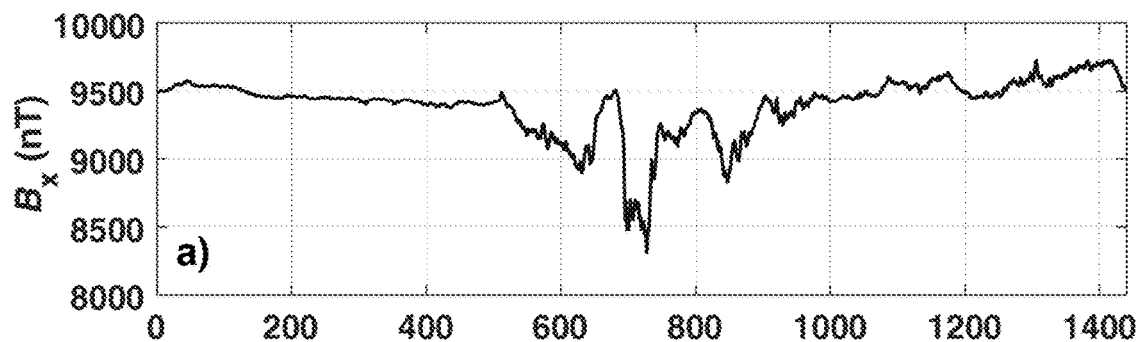
FIG. 18A illustrates an example of magnetic field measurements at a particular location.
Figure 18B:
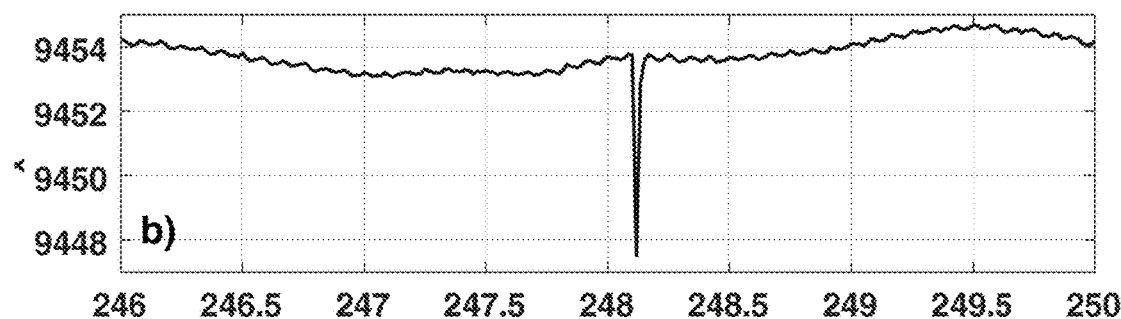
FIG. 18B illustrates a zoomed in view of a spike in the measurements of FIG. 18A.
Figure 18C:
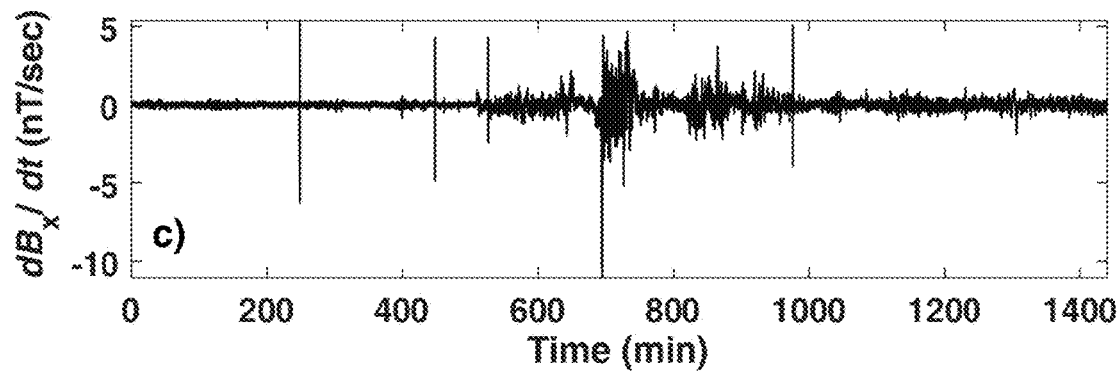
FIG. 18C illustrates a chart of the magnetic field derivative over time for the measurements of FIG. 18A.

Analyzing the B data recorded by the magnetometers revealed that abrupt changes occur at random times with distinct amplitudes that do not follow a specific pattern. These spikes have a duration of either one or two seconds. The $B_x$ signal that has been measured at Fort Churchill station, in the example experiments, is shown in FIG. 18A along with a zoomed view on a spike in FIG. 18B. Time derivative of the $B_x$ signal is determined by numerical differentiation and is depicted in FIG. 18C to give an insight on how spikes are introduced to the derivative signal. These spikes lead to an overestimated induced electric field; therefore, they are required to be eliminated from the signal.

The measurement module 150 despikes the B signal. In some cases, the measurement module 150 uses median filtering for noise and spike suppression. In some cases, a sliding window comprised of an odd number of samples is shifted across the signal, and the midpoint is replaced by the median of the samples that lie inside the window. In other cases, the measurement module 150 uses replacement at peak of differences (RPD). For RPD, a window encompassing a certain number of samples (e.g., 7 samples) is defined and shifted through the $B_x$ signal. The center point of the window is replaced in accordance to the median filtering above. This filtered signal $\tilde{B}_x$, is then subtracted from the main signal $B_x$ to generate a difference signal D. As it can be seen in FIG. 19, the spikes are more evident in this difference signal and can be detected by defining a prominence threshold. The spikes can be replaced by an updated value, since eliminating them shortens the signal and may cause an inconsistent time step among the data points. A feature of the B signal is that the spikes in the signal are not of the same width. Furthermore, at some spikes, the sample located either before or after the spike's peak in the emerging or fading transition is of high magnitude compared with the neighborhood samples. In response to this, samples (e.g., 3) with the center point at the spike's peak are replaced. Assuming peak of a spike occurs at sample $x_p$, this center point is replaced by a weighted average of nearby samples (e.g., 6) excluding the samples recorded immediately before and after $x_p$. The updated value of $x_p$ is given by $$x'_p = \sum_{k=1}^{3} \frac{k(x_{p+k-5} + x_{p+5-k})}{12}$$

The marginal data points are then replaced by the following equations:

$$x'_{p+1} = \frac{3x'_p + x_{p-2}}{4} + \sum_{k=1}^{3} \frac{k \times x_{p+5-k}}{6}$$

$$x'_{p-1} = \frac{3x'_p + x_{p+2}}{4} + \sum_{k=1}^{3} \frac{k \times x_{p+k-5}}{6}$$

Figure 20:
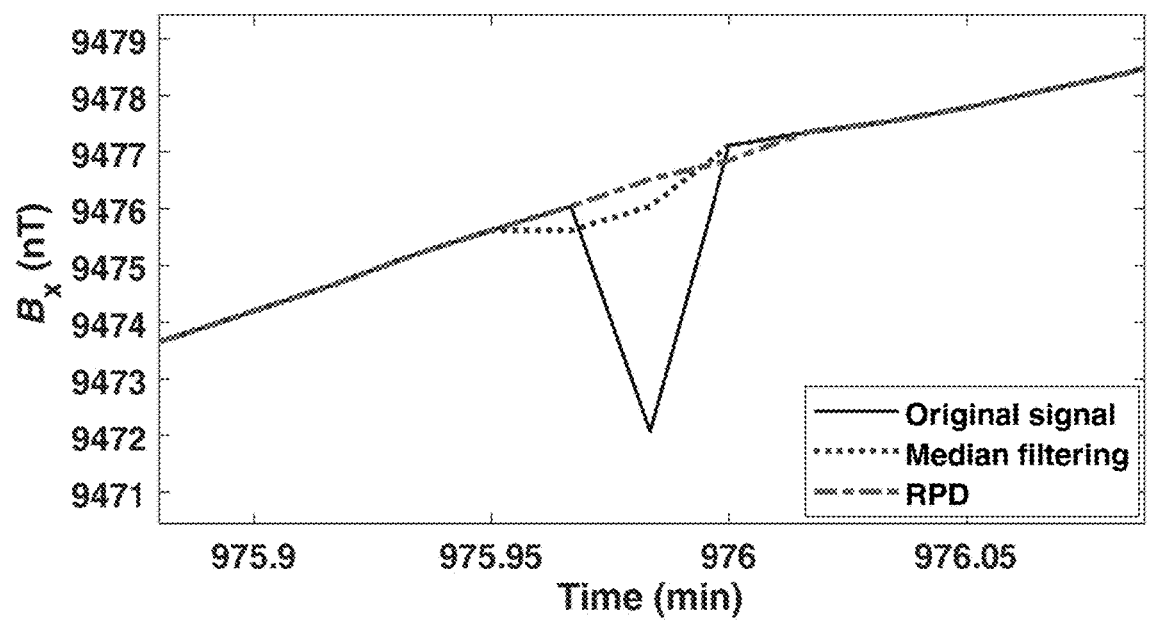
FIG. 20 illustrates a chart comparing median filtering and RPD in smoothing a spike in an example signal.

The updated center point is included in replacement of the marginal samples; however, the value of the center point $x_p$ is updated independently from the updated marginal samples. The samples nearer to the spike's peak are of a higher weight. Unlike with median filtering, the spikes are detected and then replaced. Moreover, the remining data points are remained unchanged. The two ways of despiking including median filtering and replacement at peak of differences (RPD) are compared in FIG. 20 for the signal recorded at Fort Churchill station on 2015 Aug. 15. It can be seen that the RPD method has smoothed the spike completely unlike the median filtering approach.

In some cases, the measurement module 150 can use wavelet decomposition. The drawback of using RPD is that it generally smooths the spikes under steady state conditions. In case of a spike during a severe GMD event, where the spike falls within the steep region of the B signal, wavelet decomposition may be more suitable. Further, wavelet decomposition may be useful for spikes occurring within oscillatory regions of B. Discrete wavelet transform (DWT) decomposes a signal to detail and approximation coefficients that represent high and low frequency components of the signal, respectively. Since spikes emerge suddenly in a signal, their frequency content is significantly higher than the main frequency of the signal. Hence, the spikes are noticeable in the detail signal and can be located by the same approach defined in RPD; i.e., setting a prominence threshold. DWT can be implemented by applying the signal to a set of low-pass and high-pass filters followed by a downsampling that reduces the signal length to one half. If the spikes are detected in this reduced length signal, an erroneous detection may occur. The reason is that the spike may be located at a data point that has been eliminated due to the downsampling. In response to this difficulty, stationary wavelet transform (SWT), also known as undecimated wavelet transform, can be used instead of DWT. Since the signal is not downsampled in SWT, the spikes can be located accurately in the detail signal.

Figure 19:
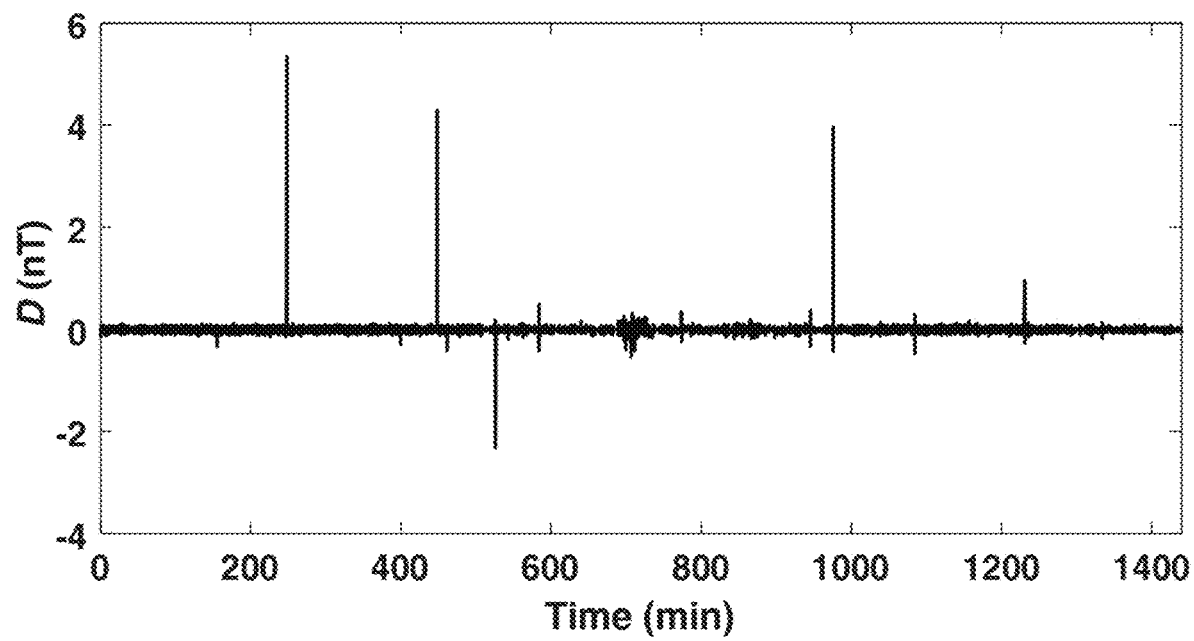
FIG. 19 illustrates a chart of a difference signal obtained by a replacement of peak of differences (RPD) approach.
Figure 21:
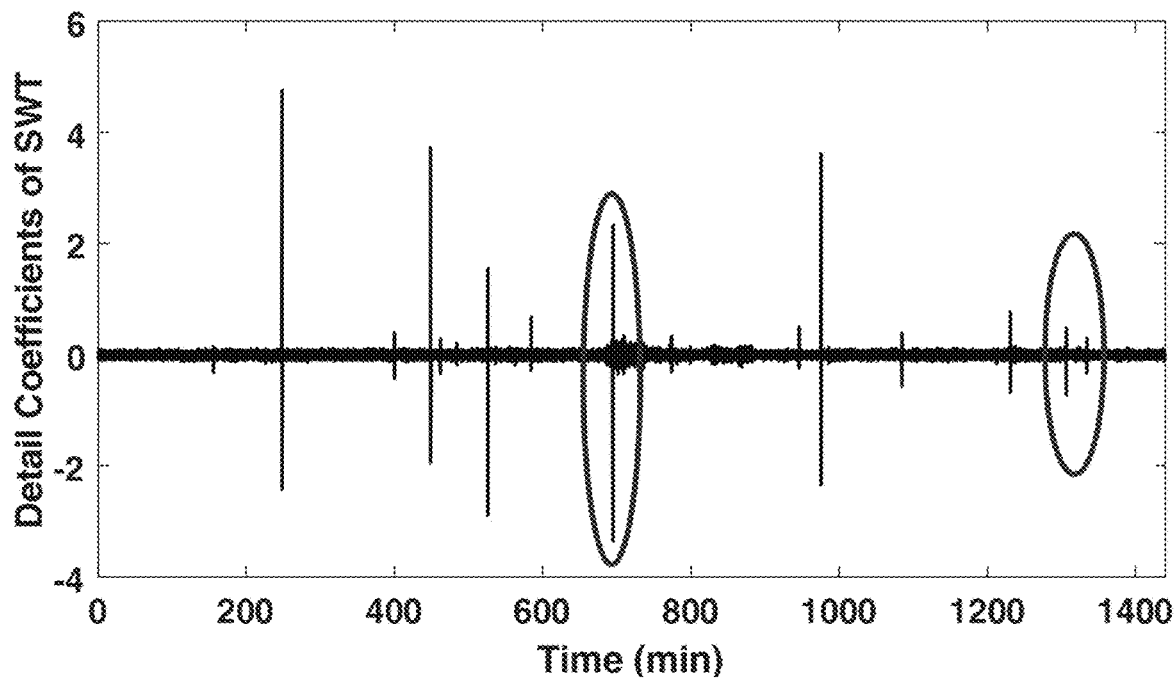
FIG. 21 illustrates spikes in detail coefficients of stationary wavelet transform (SWT) of an example signal.

Despiking with the wavelet decomposition method (WDM) involves calculating SWT of the B signal using sym4 wavelet at a decomposition level of one. The spikes in the B signal are detected by locating the peaks of the detail signal that is obtained by SWT as exemplified in FIG. 21. A comparison between FIGS. 19 and 21 show that WDM has detected all the spikes and two of them are missed by RPD, which are surrounded by ovals in FIG. 21. This implies the superiority of WDM over RPD at regions where the spike occurs during an abrupt change in the B signal, as shown by the first oval. The data point at the spikes and at the adjacent samples are replaced, similar to the approach presented in RPD. This ensures all the spikes in the signal are detected and flattened.

Denoising the B signal and eliminating its spikes prepares the signal for determining the induced electric field. Different approaches for taking derivative of a signal can be used, as described herein.

A derivative of a signal can be determined by applying numerical differentiation, where the difference between two successive samples is divided by the time step. Although simplicity and computational speed are the two advantages of this approach, the noise in the signal is amplified in its derivative. Finite differences approaches, such as backward Euler, suffer from the same disadvantage since the noises are not considered in the applied approximations. If fundamental of the system that generates the signal is known, Kalman filter, sliding mode, and super twisting methods could be useful for the derivate calculation. The simplifications made in these models cause a decrease in the accuracy if the above-mentioned differentiation methods are applied. Finite impulse response (FIR) filters can be used to take the derivative as well. Applying them on the B signals revealed two major drawbacks. First, a high filter order is required to achieve a smooth derivative signal, which leads to a longer delay in the filtered signal in addition to the introduced transient. The latter drawback is that peaks of the derivative signal, which represent the corresponding peaks in the GIC signal, are modified significantly at higher filter orders.

The present inventors determined that using wavelet transform to determine the derivative can be used, which does not present the disadvantages of the above approaches. Continuous wavelet transform (CWT) of a function $f$ is obtained by:

$$Wf(u, s) = \int_{-\infty}^{+\infty} f(t) \frac{1}{\sqrt{s}} \psi * \left(\frac{t-u}{s}\right) dt$$

where $\psi$ is a mother wavelet, and u and s are translation and dilation parameters, respectively. A fast decaying wavelet with a single vanishing moment can be defined by:

$$\psi(t) = -\frac{d\theta(t)}{dt}$$

The wavelet transform of $f$ can be written as:

$$Wf(u, s) = s\frac{d}{du}(f * \bar{\theta}_s)(u)$$

where $$\bar{\theta}_s(u) = \frac{1}{\sqrt{s}} \theta\left(-\frac{u}{s}\right).$$

The term $f*\bar{\theta}_s$ represents a weighted average of $f$, and therefore, the resulting wavelet transform yields derivate of the smoothed $f$. If the fast decaying $\theta$ has a nonzero integral as:

$$K = \int_{-\infty}^{+\infty} \theta(t) dt$$

the derivative of $f$ can be calculated as follows:

$$\lim_{s \to 0} \frac{Wf(u, s)}{s^{3/2}} = Kf^{(1)}(u)$$

An advantage of using CWT is that smoothing is incorporated into the differentiation process. The degree of smoothing is controlled by the scale parameters. Choosing a large value for the scale parameter leads to a smoother derivate signal, whereas decreases accuracy of the approximation.

Mother wavelet and value of the scale parameter are two factors to be determined before implementing the wavelet differentiation. In most cases, the choice of the appropriate mother wavelet is limited to those with one vanishing moments. Except the gaussian wavelet, other wavelets generally will provide the same results. For a specific scale value, Gaus1 wavelet modifies the peaks more and introduces a longer transient compared to the other wavelets. In response to this, sym1 wavelet is applied for taking time derivative of the B signals.

Three signals with a sampling frequency of 1 Hz and high amplitude oscillations are considered to evaluate efficiency of the differentiation. SNR and deviation in the peaks' amplitude (DPA) of the derivative signals are reported in TABLE 5. DPA is percentage of the change in the peak's amplitude with respect to the numerical differentiation of B signal as the reference signal:

$$DPA = \frac{\max(x_n) - \max(x_w)}{\max(x_n)} \times$$

where $x_w$ and $x_n$ denote the derivative signals obtained by the wavelet and numerical differentiation methods, respectively.

TABLE 5

| Station | Scale 4 | | Scale 8 | | Scale 16 | |
|---|---|---|---|---|---|---|
| | DPA | SNR | DPA | SNR | DPA | SNR |
| Fort Churchill | −1.64 | −12.62 | −5.74 | −12.49 | −12.45 | −12.19 |
| Yellowknife | −1.32 | −9.23 | −3.02 | −9.16 | −6.03 | −8.99 |
| Iqaluit | −1.53 | −16.30 | −4.82 | −16.17 | −10.79 | −15.89 |

Normalized correlation coefficient (NCC) is applied as another criterion to measure the degree of correlation between $x_w$ and $x_n$:

$$NCC_D = \frac{\sum_{k=1}^{N} x_n(k) \cdot x_w(k)}{\sqrt{\left(\sum_{k=1}^{N} x_n^2(k)\right) \cdot \left(\sum_{k=1}^{N} x_w^2(k)\right)}}$$

$NCC_M$ is calculated as well to evaluate the correlation between the main and the denoised and despiked $B_x$ signal. Value of NCC ranges from −1 to +1, where the upper limit represents the highest correlation. Both $NCC_M$ and $NCC_D$ are listed in TABLE 6. The aim is to increase SNR value of $dB_x/dt$ while the peak values are remained unmodified.

TABLE 6

| Station | Scale 4 | | Scale 8 | | Scale 16 | |
|---|---|---|---|---|---|---|
| | $NCC_M$ | $NCC_D$ | $NCC_M$ | $NCC_D$ | $NCC_M$ | $NCC_D$ |
| Fort Churchill | 1.00 | 0.99 | 1.00 | 0.98 | 1.00 | 0.12 |
| Yellowknife | 1.00 | 0.11 | 1.00 | 0.11 | 1.00 | 0.01 |
| Iqaluit | 1.00 | 1.00 | 1.00 | 0.99 | 1.00 | 0.13 |

As it can be seen in TABLE 5, SNR and DPA are updated in opposite direction with increased scale value. The same behavior is seen for NCCs in TABLE 6. Scales greater than 8 affect the peaks of $dB_x/dt$ significantly and therefore, they are ignored for the further analyses. Note that the low $NCC_D$ for Yellowknife station is because of highly distorted $B_x$ signal recorded at this station. Hence, the search for the appropriate scale in this example is limited to two values, i.e., four and eight.

Figure 22:
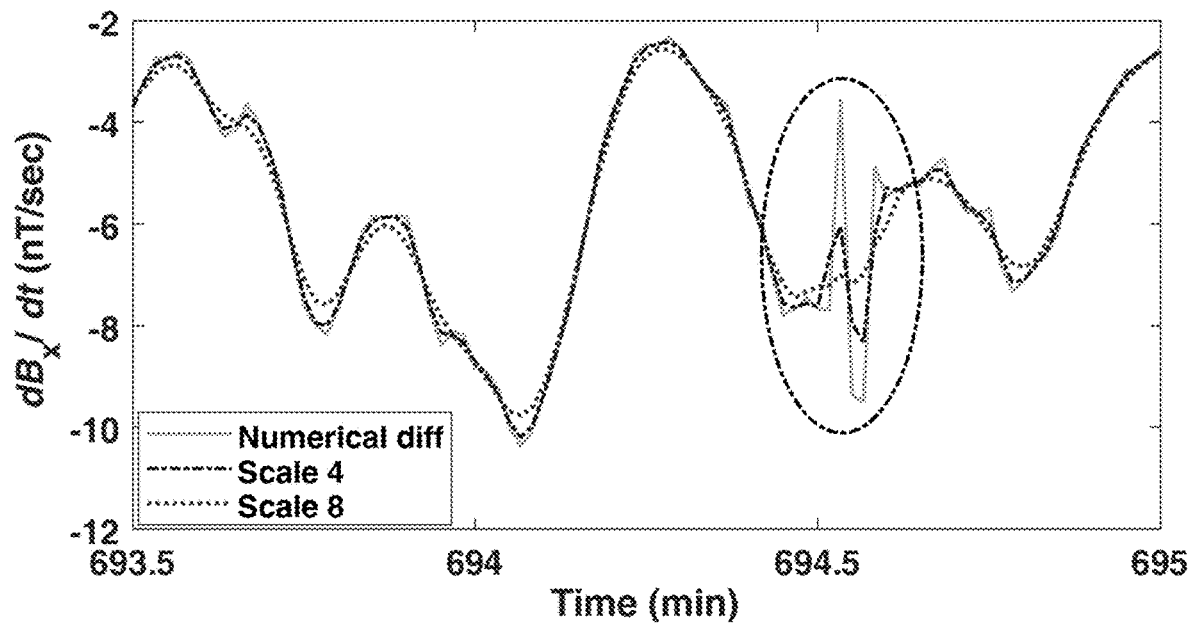
FIG. 22 illustrates the effect of a scale parameter on smoothing of the magnetic field derivative.

The $B_x$ signal received by Fort Churchill station on 2015 Aug. 15 is denoised and despiked, and its derivative is depicted in FIG. 22 for a short period of time in vicinity of the global minimum. The three signals plotted in this figure represent the derivatives obtained by numerical differentiation and by the wavelet-based method with scale values of 4 and 8. The high frequency oscillation that is encompassed by the oval in FIG. 22 is smoothed by a scale value of 8. The B signals recorded by different stations were analyzed, and a scale of 8 was capable of smoothing multiple oscillations through the dB/dt signals. Consequently, sym1 wavelet with a scale value of 8 is considered to approximate the derivative of B signals.

Figure 23:
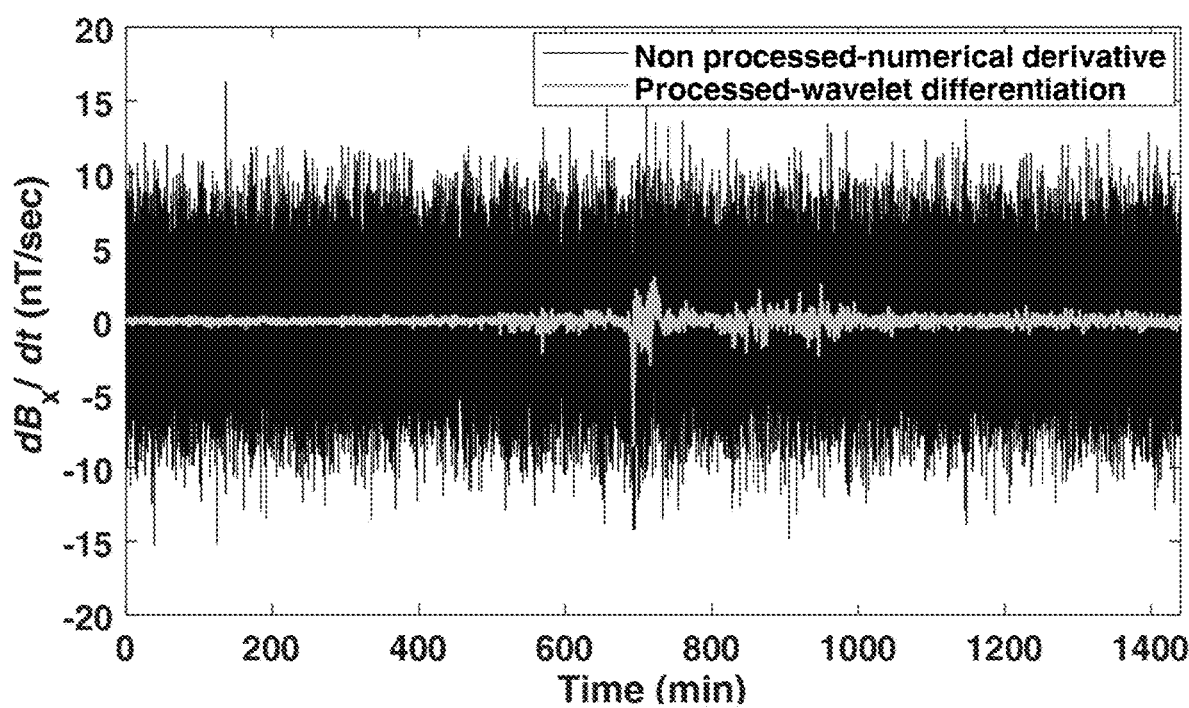
FIG. 23 illustrates performance of signal processing, in accordance with an embodiment, on an example signal.

According to TABLE 5, the $B_x$ signal captured by the magnetometer at Yellowknife station includes significant noises. Time derivate of the processed $B_x$ signal that is obtained by the wavelet differentiation is plotted versus numerical derivative of the original $B_x$ signal in FIG. 23. The derivative of the original signal is not interpretable due to the amplified noise, whereas the noises are considerably mitigated in the derivate of the processed $B_x$ signal. This implies the importance of processing the B signals prior to the implementation of the GIC determination.

Both numerical and wavelet differentiation approximate the time derivative of the signal. Accuracy of this approximation is dominated by the sampling frequency or the time difference between two successive samples Δt. Sampling frequency is required to be a sufficient high multiple of the highest frequency component of the signal to ensure the accuracy of the approximation. A Fourier analysis reveals that main frequency components of the B signals are less than 1 mHz during a GMD event. On the other hand, sampling frequency $F_s$ of 1 Hz for the B components is not always available due to practical limitations concerned with transmitting the measured B data.

A quantitative analysis is presented to evaluate the relationship between $F_s$ and $f_{max}$. A noise free sine function is defined as y(t)=10 sin (2πft) where f is the frequency of y signal. Unlike the B signal where its reference derivative signal is not available, the reference values for time derivative of y signal are obtained by taking derivative of y function as dy/dt. The peaks of dy/dt are compared with peaks of Δy/Δt, i.e., numerical derivative of y, in terms of DPA percentages in TABLE 7 for different ratios of $R=F_s/f$. Based on the results reported in TABLE 7, DPA is less than or equal to 2% for R values greater than 18. Having this value of DPA as the limit, sampling frequency of the B signal should be at least 18 times higher than its main frequency component, i.e., 1 mHz. This limitation ensures that the peaks' amplitude is preserved in the derivative signal. Therefore, the minimum acceptable sampling frequency for the B signals is approximately 18×1 mHz. Assuming 1/60 Hz as the base sampling rate, the minimum sampling frequency can be rewritten as 1/60×1.1 Hz.

TABLE 7

| Case | R = $F_s$/f | DPA (%) |
|---|---|---|
| 1 | 8 | 9.97 |
| 2 | 12 | 4.51 |
| 3 | 14 | 3.32 |
| 4 | 16 | 2.55 |
| 5 | 18 | 2.02 |
| 6 | 20 | 1.64 |

The B signal has two major differences with the simple y signal. First, the B signal contains various frequency components, and the latter is the presence of noises in the B. The maximum frequency component of the B signals is less than 1 mHz. According to TABLE 7, lower frequency components affect DPA less given a constant sampling rate. In this regard, DPA reaches a value less than the 2% limit if the major frequency component equals 1 mHz or less. The latter difference, which is the noises in the B signal, is controlled by the scale parameter of CWT that is applied for the differentiation. An increased scale value mitigates the noises, whereas affects the peaks by increasing DPA. Sampling frequency plays a significant role in the DPA improvement.

The derivative of y signal with f equals 1 mHz is obtained by both the CWT approach and by dy/dt for different sampling frequencies, and the corresponding DPAs are listed in TABLE 8. Note that DPA in this case is calculated by (9) where $x_2$ denotes dy/dt. As it can be inferred from TABLE 8, DPA is directly proportional to the scale parameter of CWT for a given sampling frequency. On the other hand, oversampling prevents the differentiation to cause a noticeable DPA. According to Tables II and III, a scale of 8 is the optimum condition for denoising the B signal to an acceptable level. This requires the sampling rate to be at least 1/60×4 Hz to ensure DPA becomes less than the predetermined value of 2%.

TABLE 8

| Case | $F_s$ (Hz) | Scale | DPA (%) |
| --- | --- | --- | --- |
| 1 | 1/60 | 2 | 0.79 |
| 2 | 1/60 | 4 | 4.27 |
| 3 | 1/60 | 8 | 17.24 |
| 4 | 1/60 × 2 | 2 | 0.20 |
| 5 | 1/60 × 2 | 4 | 1.08 |
| 6 | 1/60 × 2 | 8 | 4.55 |
| 7 | 1/60 × 4 | 2 | 0.05 |
| 8 | 1/60 × 4 | 4 | 0.27 |
| 9 | 1/60 × 4 | 8 | 1.15 |

The sampling frequency is determined with respect to the dominant frequency component of the B signal as well as the scale parameter of CWT. These two factors impose a minimum $F_s$ requirement equal to 1/60×1.1 Hz and 1/60×4 Hz, respectively. The maximum of these two values yields the minimum acceptable $F_s$. Consequently, the magnetometers take samples of B signal at least at 15 s intervals in this example. As a comparison between numerical and the wavelet differentiation, case number 4 in TABLE 7 has a frequency ratio approximately the same as the first three cases in TABLE 8 with $F_s/f=(1/60)/(1\times10^{-3})$. The numerical differentiation method, however, yields a DPA of 2.55%, whereas DPAs for the wavelet differentiation method range from 0.79% to 17.24% depending on the scale parameter. This implies superiority of the wavelet differentiation method over the numerical differentiation in case an appropriate value for the scale parameter is chosen.

Figure 24:
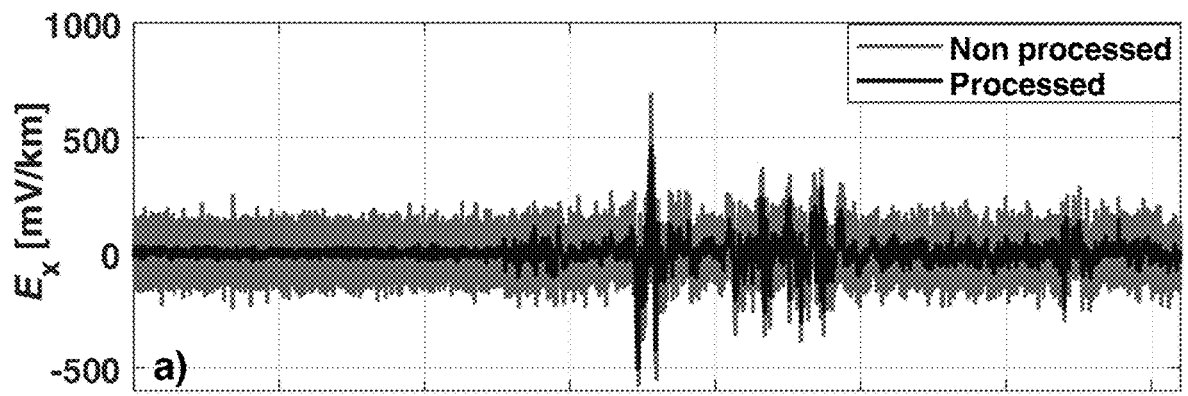
FIGS. 24 and 25 illustrate electric field components, $E_x$ and $E_y$, respectively, for an example recorded signal.
Figure 25:
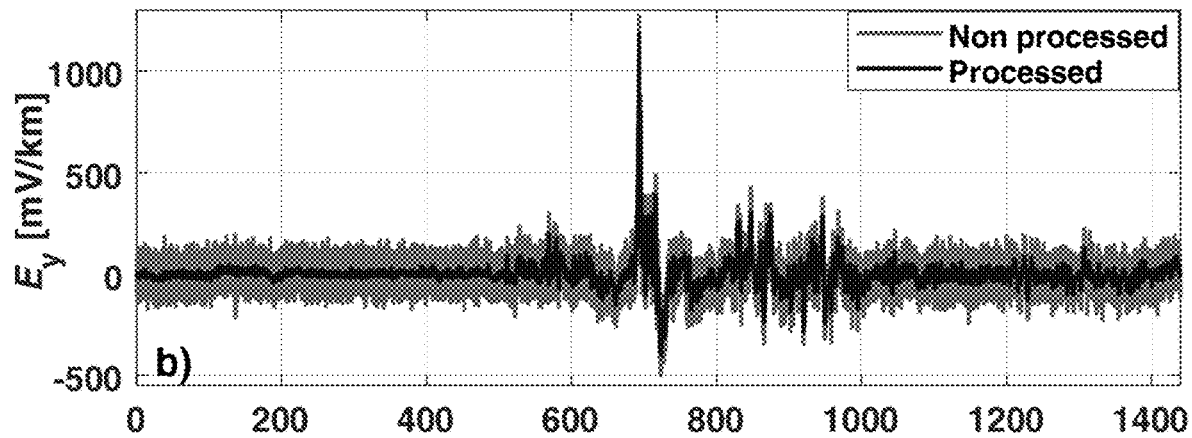

A noise and spike free dB/dt signal allows for more accurate calculation of the GIC flowing through the power grid. The processed dB/dt signal can be applied to earth models for different geographical zones to obtain the induced geoelectric field on the earth's surface in the corresponding regions. Given a multi-layer earth model and the earth transfer function $C(\omega)$, the induced geoelectric field can be determined as follows in time domain:

$$E_x(t) = c(t) * \left(\frac{dB_y(t)}{dt}\right)$$

$$E_y(t) = -c(t) * \left(\frac{dB_x(t)}{dt}\right)$$

where $E_x$ and $E_y$ represent the northward and eastward components of the geoelectric field, respectively. The $E_x$ and $E_y$ components were determined based on both the processed and non-processed B data that have been recorded at the Yellowknife station, and the results are compared in FIGS. 24 and 25 for $E_x$ and $E_y$ respectively. The noises and spikes in the $B_x$ and $B_y$ signals are reflected in the geoelectric field components. Nevertheless, effectiveness of the signal processing is verified in FIGS. 24 and 25 by a significant reduction in the noises as well as preserving the peaks' amplitude.

Figure 17:
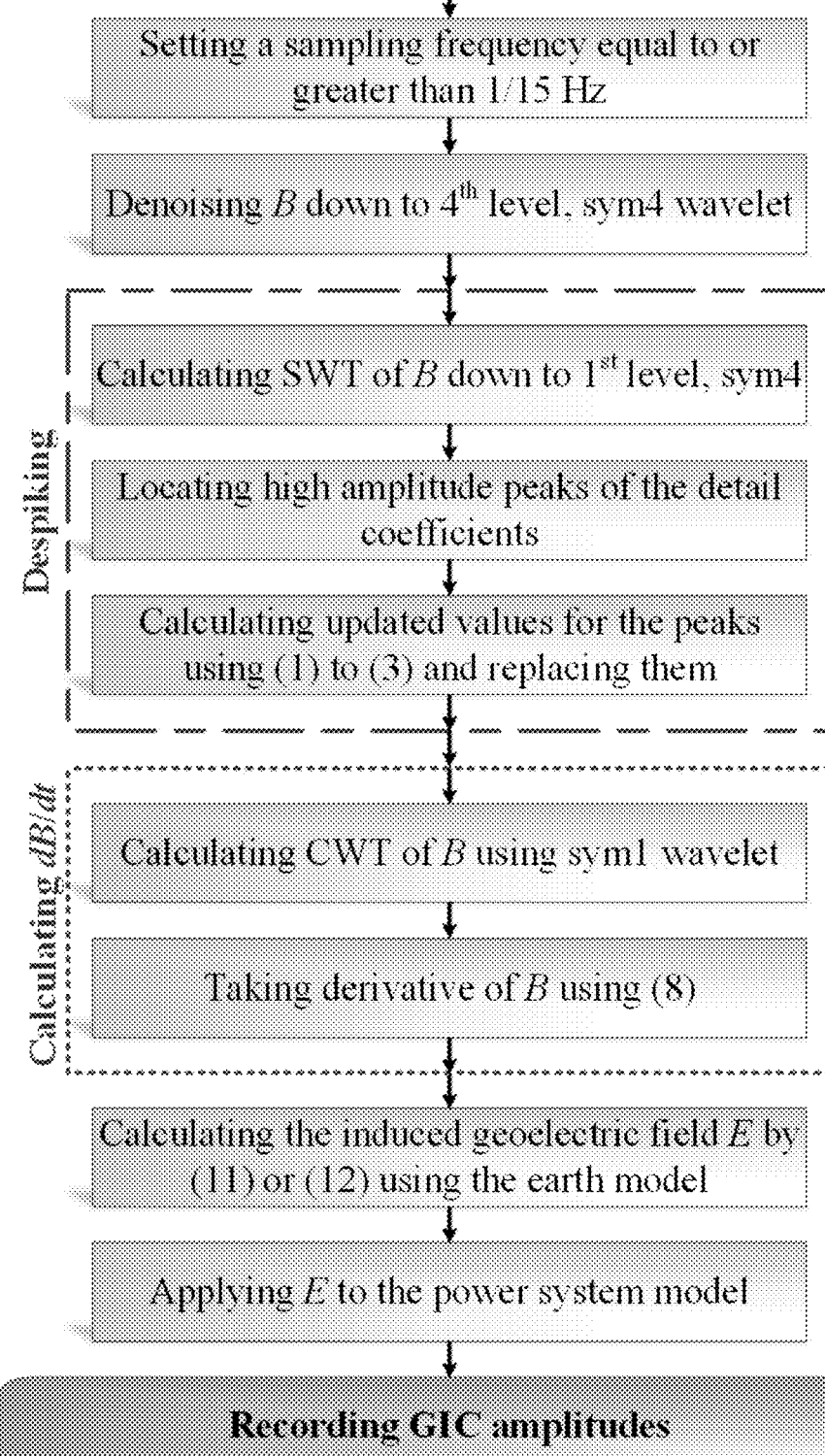
FIG. 17 is a flow chart of an approach for wide-are GIC determination, in accordance with the method of FIG. 2.
Figure 26:
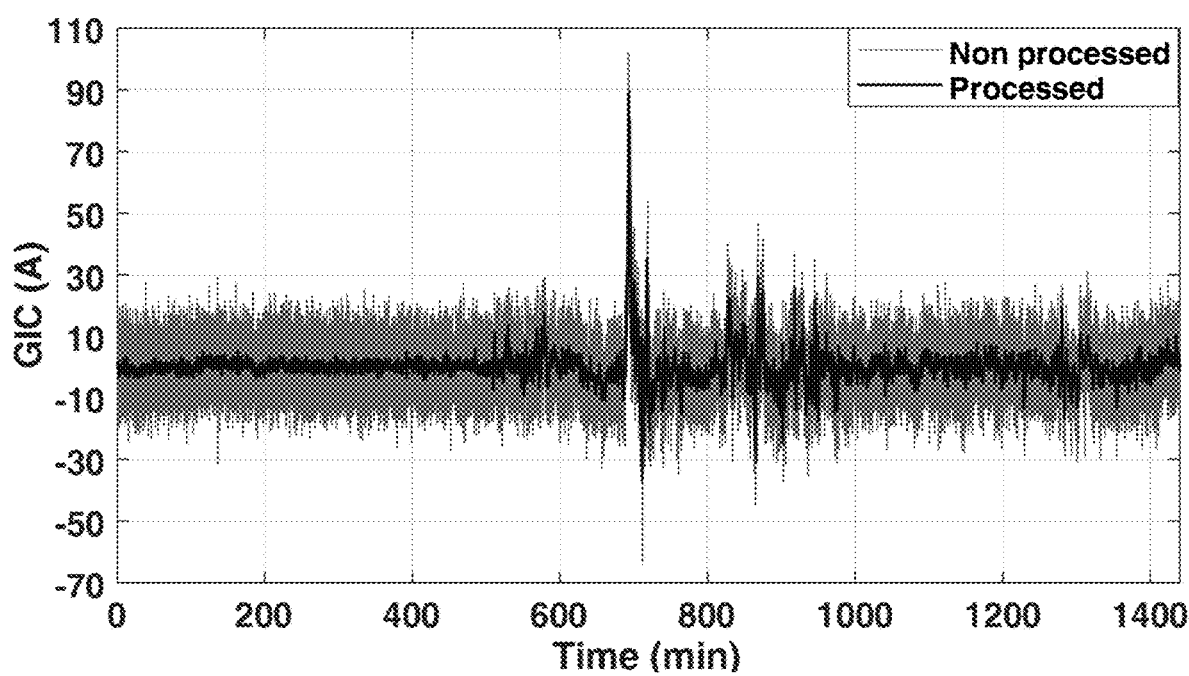
FIG. 26 illustrates GIC amplitude for an example bus associated with example magnetic field data.

A modified 118-bus benchmark system is applied to verify the effectiveness and accuracy of the proposed signal processing method. The block diagram in FIG. 17 shows processing of the B signal step by step followed by a power system analysis. The B signal recorded by Yellowknife station on 2015 Aug. 15 is considered for the GIC calculation verification. The geoelectric field induced by both the processed and unprocessed B signals are obtained, and the corresponding GICs in the power grid are calculated. The GICs in the neutral connection of the grid's power transformers are ranked based on their magnitude. The simulation results revealed that the highest GIC magnitude appears on the transformer installed on bus number 24. The simulated GICs on this bus are depicted in FIG. 26. As it can be seen, processing the B signal has caused a significant improvement in the accuracy of the obtained GICs by mitigating the noises and the spikes. To cite an instance, magnitude of the first and the second ranked peaks in the unprocessed GIC signal is decreased by 13% and 42% respectively, compared with the corresponding peaks in the processed GIC signal. The signal processing prevents an overestimation of the GIC particularly during peak of the GMD event, which is of the highest importance due to the impacts on the power system.

Figure 27:
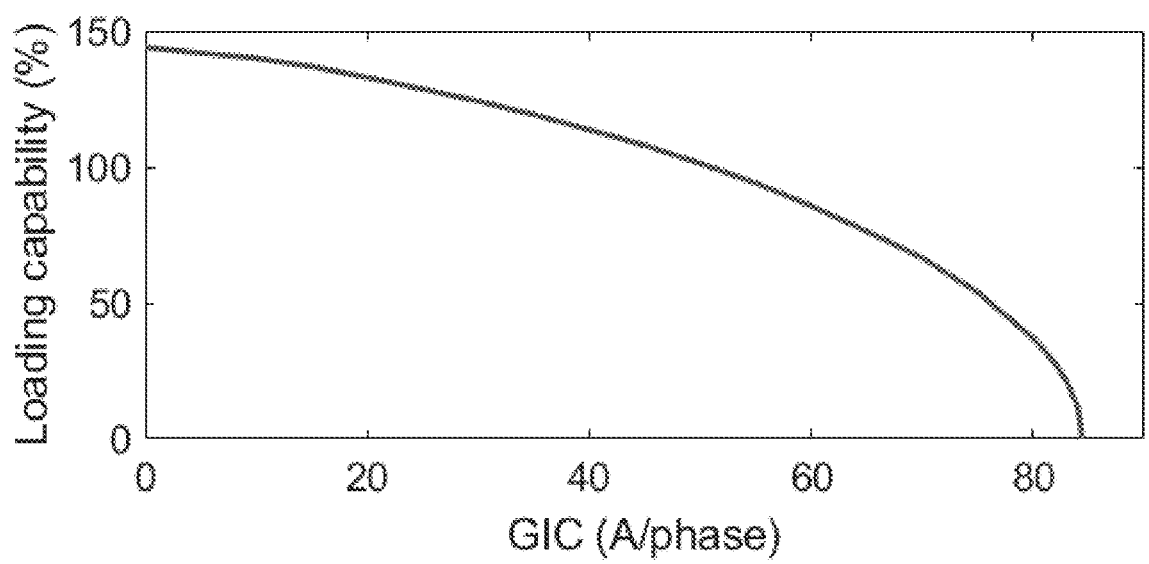
FIG. 27 illustrates an example loading capability curve was determined for the safe operation of a MOT for a wind farm during a geomagnetic disturbance (GMD).

The embodiments of the present disclosure can be used for various suitable applications. In an example, to determine impacts of GIC on wind farm operating conditions. In particular, the GIC effects on the wind farm main output transformer (MOT) and the doubly fed induction generator (DFIG). Such analysis can include a thermal analysis to estimate hot-spot heating of the MOT, when subjected to the GIC benchmark waveform with various magnitudes. The present inventors determined that hot-spot temperature of the MOT winding increases beyond the maximum standard level of 180° C., when the peak of the benchmark GIC exceeds 70 A/phase. Thus, an example loading capability curve was determined for the safe operation of MOT during the GMD, as illustrated in FIG. 27.

In another example application, embodiments of the present disclosure can be used to determine a transformer bushing thermal model. Thermal stress plays a prominent role in reliability of bushings and contributes to reliability of power transformers, especially during overload conditions. Thus, understanding temperature distribution and oil flow in the bushings is beneficial to ensure safe and reliable operation of bushing and the associated transformer, under various loading conditions. The hot spot temperature (HST) of oil impregnated paper (OIP) bushing based on finite element method (FEM)-modified thermal equivalent circuit (TEC) model. In order to find nonlinear characteristics of the resultant convection thermal resistances, the temperature pattern, and fluid velocity in the bushing have been modeled by FEM. In the absence of convective resistances, a significant difference can be observed between TEC and FEM results, for instance 74.5° C. at 2 pu loading. In addition, the effects of different parameters such as load current, transformer top oil temperatures (TTOT), and oil flow on HST were investigated by the present inventors. TTOT noticeably influences the HST and the temperature distribution on the bottom of bushing, due to the proximity to the transformer top oil. The HST nonlinearly varies with TTOT and for example a decrease of 30° C. in transformer oil temperature results in an HST decrease of 24° C. However, the temperature distribution in the top part of the bushing is not affected by the TTOT due to the effects of ambient temperature and high convection rate in that area Although the invention has been described with reference to certain specific embodiments, various modifications thereof will be apparent to those skilled in the art without departing from the spirit and scope of the invention as outlined in the claims appended hereto. The entire disclosures of all references recited above are incorporated herein by reference.

The invention claimed is:

1. A method for geomagnetic disturbance determination for a power system, the method executed on one or more processors, the method comprising:
   receiving sensor data comprising a geomagnetic field experienced by multiple portions of the power system;
   denoising and despiking the sensor data to obtain a processed electric field signal;
   determining a total Geomagnetically Induced Current (GIC) as a multi-variable function of phasors in two field directions proportional to the processed electric field signal;
   determining one or more maximum magnitudes of the total GIC, and a corresponding direction, as a measure of geomagnetic disturbance vulnerability, comprising setting a gradient of the total GIC to zero to determine one or more extremum points;
   determining elements in the power system at risk of failure by comparing the one or more maximum GIC magnitudes with withstand capabilities associated with each of the elements; and
   outputting the elements in the power system at risk of failure or the determined one or more maximum GIC magnitudes and the corresponding directions.

2. The method of claim 1, further comprising determining a corresponding critical solution point to check whether a solution point to setting the gradient of the total GIC to zero is an extremum point.

3. The method of claim 2, wherein the solution point is an extremum point if a determinant of a Hessian matrix of the critical solution point is greater than zero.

4. The method of claim 1, further comprising determining the gradient of the total GIC comprises determining derivatives of the processed electric field signal using continuous wavelet transform.

5. The method of claim 1, further comprising determining a global maximum magnitude by solving for angular frequency.

6. The method of claim 1, further comprising despiking the geomagnetic field data using median filtering.

7. The method of claim 1, further comprising despiking the geomagnetic field data using replacement at peak of differences (RPD) comprising replacing a center point of a window of the sensor data using median filtering to generate a filtered signal, subtracting the filtered signal from the original sensor data to generate a difference signal, applying a prominence threshold to the difference signal to detect spikes, and replacing the spikes with a weighted average.

8. The method of claim 1, further comprising despiking the geomagnetic field data using wavelet decomposition by determining stationary wavelet transform using a sym4 wavelet at a decomposition level of one.

9. A system for geomagnetic disturbance determination for a power system, the system comprising one or more processors in communication with a memory storage, the one or more processors configurable to execute:
   a measurement module to receive sensor data comprising a geomagnetic field experienced by one or more portions of the power system, and to denoise and despike the sensor data to obtain a processed electric field signal;
   a determination module to determine a total Geomagnetically Induced Current (GIC) as a multi-variable function of phasors in two field directions proportional to the processed electric field signal, to determine one or more maximum magnitudes of the total GIC, and a corresponding direction, as a measure of geomagnetic disturbance vulnerability, comprising setting a gradient of the total GIC to zero to determine one or more extremum points, and to determine elements in the power system at risk of failure by comparing the one or more maximum GIC magnitudes with withstand capabilities associated with each of the elements; and
   an output module to output the elements in the power system at risk of failure or the determined one or more maximum GIC magnitudes and the corresponding directions.

10. The system of claim 9, wherein the determination module further determines a corresponding critical solution point to check whether a solution point to setting the gradient of the total GIC to zero is an extremum point.

11. The system of claim 10, wherein the solution point is an extremum point if a determinant of a Hessian matrix of the critical solution point is greater than zero.

12. The system of claim 9, wherein determining the gradient of the total GIC comprises determining derivatives of the processed electric field signal using continuous wavelet transform.

13. The system of claim 9, wherein the determination module further determines a global maximum magnitude by solving for angular frequency.

14. The system of claim 9, wherein the measurement module further despikes the geomagnetic field data using median filtering.

15. The system of claim 9, wherein the measurement module further despikes the geomagnetic field data using replacement at peak of differences (RPD) comprising replacing a center point of a window of the sensor data using median filtering to generate a filtered signal, subtracting the filtered signal from the original sensor data to generate a difference signal, applying a prominence threshold to the difference signal to detect spikes, and replacing the spikes with a weighted average.

16. The system of claim 9, wherein the measurement module further despikes the geomagnetic field data using wavelet decomposition by determining stationary wavelet transform using a sym4 wavelet at a decomposition level of one.

* * * * *